United States Patent
Miatton et al.

(10) Patent No.: US 11,522,537 B2
(45) Date of Patent: Dec. 6, 2022

(54) GALVANIC ISOLATED GATE DRIVER BASED ON A TRANSFORMER USED FOR BOTH POWER TRANSFER FROM PRIMARY TO SECONDARY COIL AND DATA TRANSMISSION

(71) Applicant: Infineon Technologies Austria AG, Villach (AT)

(72) Inventors: Daniele Miatton, Carbonara al Ticino (IT); Sergio Morini, Pavia (IT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 17/209,450

(22) Filed: Mar. 23, 2021

(65) Prior Publication Data

US 2022/0311433 A1   Sep. 29, 2022

(51) Int. Cl.
*H03K 17/567* (2006.01)
*H03L 7/08* (2006.01)

(52) U.S. Cl.
CPC ............ *H03K 17/567* (2013.01); *H03L 7/08* (2013.01); *H03K 2217/0063* (2013.01); *H03K 2217/0072* (2013.01); *H03K 2217/0081* (2013.01)

(58) Field of Classification Search
CPC ......... H03K 17/567; H03K 2217/0063; H03K 2217/0072; H03K 2217/0081; H03L 7/08
See application file for complete search history.

(56) References Cited

U.S. PATENT DOCUMENTS

| | | | |
|---|---|---|---|
| 8,816,653 B2 | 8/2014 | Nuebling et al. | |
| 10,673,345 B2* | 6/2020 | Bergogne | ............ H02M 3/3382 |
| 2009/0212759 A1 | 8/2009 | Melanson | |
| 2015/0180528 A1* | 6/2015 | Ragonese | ............ H03B 5/1296 |
| | | | 375/219 |
| 2019/0386569 A1 | 12/2019 | Bergogne | |

FOREIGN PATENT DOCUMENTS

| | | |
|---|---|---|
| DE | 102004033125 A1 | 2/2006 |
| WO | 2019068932 A1 | 4/2019 |

OTHER PUBLICATIONS

Extended European Search Report for Application No. EP22020084.4, dated Aug. 5, 2022, 08 pages.

* cited by examiner

*Primary Examiner* — Ryan Johnson
*Assistant Examiner* — Colleen J O Toole
(74) *Attorney, Agent, or Firm* — Harrity & Harrity, LLP

(57) ABSTRACT

A gate driver communication system includes a cored transformer including a primary coil and a secondary coil configured to receive power signals and uplink data signals from the primary coil; a primary side power signal generator coupled to the primary coil and configured to generate the power signals having a first frequency; a primary side data transmitter coupled to the primary coil and configured to generate the uplink data signals having a second frequency different from the first frequency; and a primary side controller configured to allocate the power signals and the uplink data signals to the primary coil according to a plurality of time slots, wherein the power signals are allocated to first time slots of the plurality of time slots and the uplink data signals are allocated to second times slots of the plurality of time slots.

24 Claims, 8 Drawing Sheets

GALVANIC ISOLATED GATE DRIVER BASED ON A TRANSFORMER USED FOR BOTH POWER TRANSFER FROM PRIMARY TO SECONDARY COIL AND DATA TRANSMISSION

BACKGROUND

Many modern electronic circuits, such as switching voltage converters and motor drivers, make use of power switches to control the flow of high current levels. A power switch typically requires a driver circuit for sourcing current to and sinking current from a control terminal (e.g., a gate) of the power switch. The driver for a power switch that has a load terminal (e.g., a source) coupled directly to ground may be relatively straightforward, as the circuitry for such a driver may be ground-referenced. However, power switches are often not coupled directly to ground. For example, a half bridge configuration may include a low-side power switch that is coupled between ground and a switching node, and a high-side power switch that is coupled between a positive-voltage power rail and the switching node. In other examples, a switched-capacitor converter or a multi-level class-D amplifier may include a series of cascaded power switches between a ground and a positive voltage rail, wherein the voltages at load terminals (e.g., sources) of the intermediate power switches typically fall between ground and the positive voltage.

Accordingly, a gate driver system may include a low voltage (LV) gate driver used to drive a low-side transistor switch and an HV gate driver used to drive a high-side transistor switch. The LV gate driver may be arranged in a low voltage domain on an low-side, input chip, whereas the HV gate driver may be arranged in a high voltage domain on a high-side, output chip that is galvanically isolated from the low voltage domain (i.e., from the low-side, input chip). Power switches may also reside in other voltage domains, such as intermediary voltage domains that reside between the LV domain and the HV domain. Typically, the HV gate driver receives control signals and possibly other communication signals from a circuitry located in the low voltage domain. Accordingly, methods are needed to transmit signals between the LV domain and the HV domain.

Power switches that are not coupled to ground, e.g., high-side or other floating power switches, present unique challenges for driving, including transmitting control signals (e.g., driving signals) across voltage domains to the HV gate driver. Consider, e.g., an n-channel metal-oxide semiconductor field-effect transistor (MOSFET) power switch having a source, a drain, and a gate (control terminal). The turn-on voltage driven onto the MOSFET gate is referenced to the source voltage, which may be floating. The HV driver typically has a reference terminal for coupling to the MOSFET source, and must be provided with a supply providing power at a positive voltage, e.g., 5V, above the reference (source) voltage. Hence, a floating power supply, referenced to the MOSFET source voltage, is needed. Furthermore, the HV driver input, which is typically a digital signal alternating, e.g., between ground and 3V, usually requires that its voltage be level shifted in accordance with the MOSFET source voltage.

Coreless transformers or optocouplers may be used in galvanically isolated gate drivers to communicate bidirectionally across voltage domains (e.g., between input and output chips). Signal transmissions may be used to provide control signals and other communication signals.

While coreless transformers ensure good general performances, it shows at least two points of weakness. First, on-chip, HV galvanic isolation is needed to electrically isolate the low-side coil residing in the LV domain from the high-side coil residing in the HV domain. Accordingly, special technology is needed to ensure isolation, which adds manufacturing costs. Second, an external isolated power supply is needed to supply the floating output circuit, including the HV gate driver. The qualification of HV galvanic isolation on-chip is tricky and problematic. Furthermore, the standards for the HV galvanic isolation to ensure normal, safe operation are becoming more and more strict.

A main drawback for optocouplers is their performance decreases with age. As with coreless transformers, an external isolated power supply is also needed to supply the floating output circuit.

Accordingly, coreless transformers and optocouplers used to transmit communication signals between voltage domains both require powerful isolated power supplies usually made by an external discrete transformer to supply the floating output circuit. As such, the signal transmission path and the floating power supply path are implemented using two different structures.

Therefore, an improved device that utilizes one shared structure for both the transfer of communication signals and power between low-side and high-side chips may be desirable.

SUMMARY

Embodiments provide a gate driver communication system, including: a cored transformer including a primary coil arranged on a primary side, a secondary coil arranged on a secondary side, and a core that links the primary coil to the secondary coil, wherein the secondary coil is configured to receive power signals and uplink data signals from the primary coil; a primary side power signal generator coupled to the primary coil and configured to generate the power signals having a first frequency; a primary side data transmitter coupled to the primary coil and configured to generate the uplink data signals having a second frequency different from the first frequency; and a primary side controller configured to allocate the power signals and the uplink data signals to the primary coil according to a plurality of time slots, wherein the power signals are allocated to first time slots of the plurality of time slots and the uplink data signals are allocated to second times slots of the plurality of time slots.

Embodiments further provide a gate driver communication system, including: a cored transformer including a primary coil arranged on a primary side, a secondary coil arranged on a secondary side, and a core that links the primary coil to the secondary coil, wherein the secondary coil is configured to receive a data encoded power signal; a primary side power signal generator coupled to the primary coil and configured to generate the data encoded power signal with a fixed frequency and a phase that varies based on an encoded bit value; a power transfer carrier generator arranged on the primary side and configured to generate a zero-phase power carrier signal having the fixed frequency and a fixed phase; an inverter configured to invert the zero-phase power carrier signal to generate a phase-shifted power carrier signal; and a diverter configured to selectively couple the zero-phase power carrier signal to the primary side power signal generator to encode a first bit value onto the data encoded power signal, and to selectively couple the phase-shifted power carrier signal to the primary side power signal generator to encode a second bit value onto the data encoded power signal, wherein the primary side power signal generator is configured to generate the data encoded power signal with encoded bits thereon based on receiving the zero-phase power carrier signal or the phase-shifted power carrier signal.

Embodiments further provide a gate driver communication system, including: a cored transformer including a primary coil arranged on a primary side, a secondary coil arranged on a secondary side, and a core that links the primary coil to the secondary coil, wherein the secondary coil is configured to receive a data encoded power signal; and a phase-locked loop (PLL)-based receiver coupled to the secondary coil and configured to receive and decode the data encoded power signal to extract encoded bits therefrom. The PLL-based receiver includes: a PLL configured to generate a PLL signal that is locked in frequency and phase to a reference signal; a two-phase discriminator circuit configured to receive the PLL signal and determine a phase of the data encoded power signal received at the secondary coil based on the PLL signal; and a bit decoder configured to extract the encoded bits based on the determined phase of the data encoded power signal relative to a phase of the PLL signal.

BRIEF DESCRIPTION OF THE DRAWINGS

Embodiments are described herein making reference to the appended drawings.

DETAILED DESCRIPTION

Figure 1:
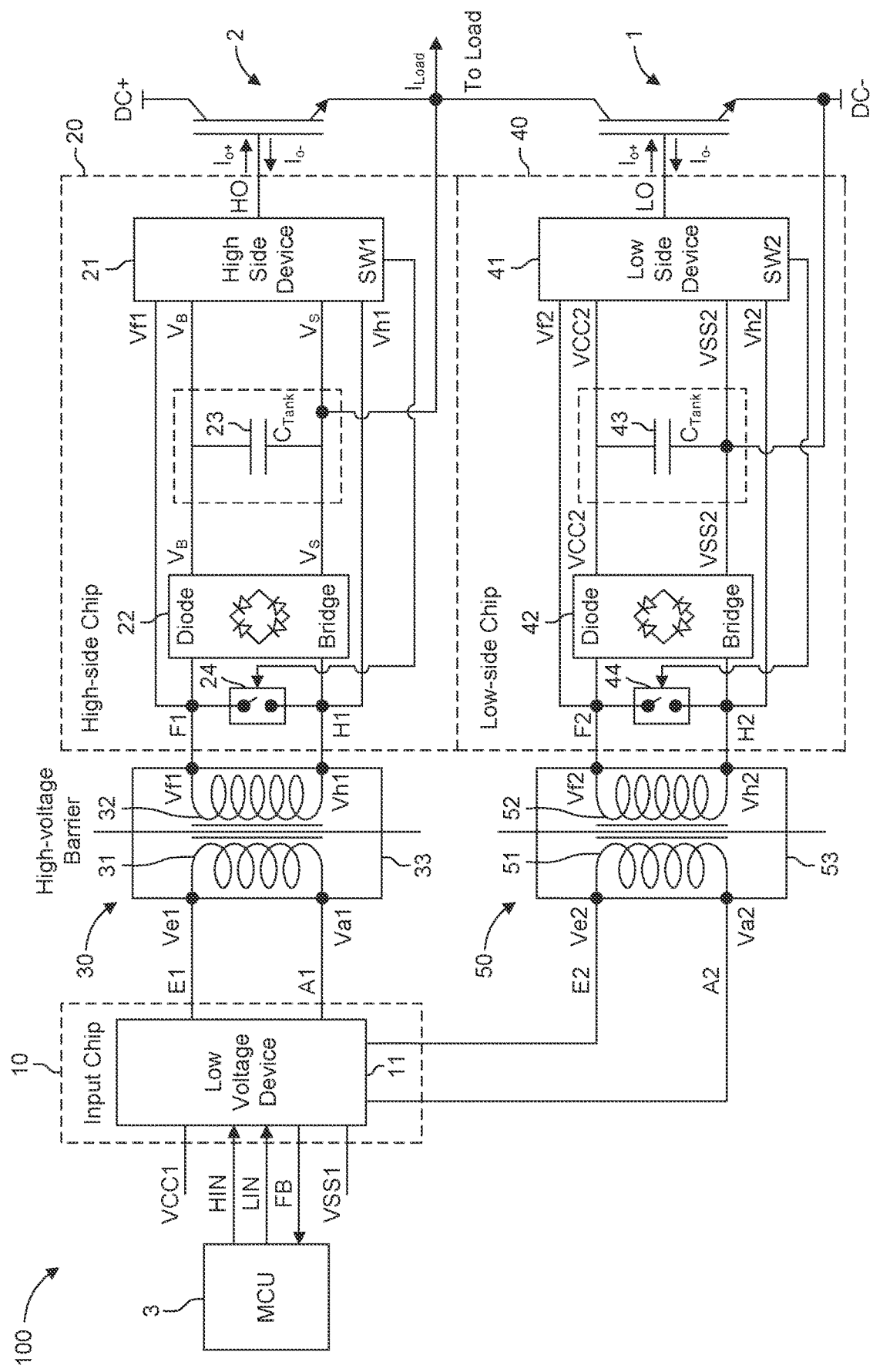
FIG. 1 is a schematic block diagram of a multi-voltage domain system according to one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "above", "front", "behind", "back", "leading", "trailing", etc., may be used with reference to the orientation of the figures being described. Because parts of embodiments can be positioned in a number of different orientations, the directional terminology is used for purposes of illustration. It is to be understood that other embodiments may be utilized and structural or logical changes may be made without departing from the scope defined by the claims. The following detailed description, therefore, is not to be taken in a limiting sense. Directional terminology used in the claims may aid in defining one element's spatial or positional relation to another element or feature, without being limited to a specific orientation.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The terms "substantially" and "approximately" may be used herein to account for small manufacturing tolerances (e.g., within 5%) that are deemed acceptable in the industry without departing from the aspects of the embodiments described herein. For example, a resistor with an approximate resistance value may practically have a resistance within 5% of that approximate resistance value.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor structure configured to conduct a load current along a load current path between two load terminal structures or load electrodes (e.g., the source/emitter and the drain/collector) of the device. Further, the load current path may be controlled by means of a control electrode, sometimes referred to as gate electrode. For example, upon receiving a corresponding control signal from, e.g., a driver unit, the control electrode may set the power semiconductor device in one of a conducting state or a blocking state. A control signal may by a voltage signal or a current signal having a controlled value.

A power transistor, also referred to as a power switch or a transistor switch, is a power semiconductor device that may be used to drive a load current. For example, an IGBT is turned "ON" or "OFF" by activating and deactivating its gate terminal. Applying a positive input voltage signal across the gate and the emitter will keep the device in its "ON" state, while making the input gate signal zero or slightly negative will cause it to turn "OFF". There is a turn-on process and a turn-off process for switching the power transistor on and off.

During the turn-on process, a gate driver integrated circuit (IC) may be used to provide (source) a gate current (i.e., an ON current) to the gate of the power transistor in order to charge the gate to a sufficient voltage to turn on the device. In particular, current Io+ is a gate driver output current used to rise (i.e., charge) the gate of the power transistor during a turn on transient. Thus, it is used to turn on the power transistor.

In contrast, during the turn-off process, the gate driver IC is used to draw (sink) a gate current (i.e., an off current) from the gate of the power transistor in order to discharge the gate sufficiently to turn off the device. Current Io− is a gate driver output current used to discharge the gate of the power transistor during a turn off transient. Thus, it is used to turn off the power transistor.

A voltage pulse may be output from the gate driver IC as the control signal according to a pulse width modulation (PWM) scheme. Thus, the control signal may be switched between an ON voltage level and an OFF voltage level during a PWM cycle for controlling a power transistor. This in turn charges and discharges the gate voltage to turn on and off the power transistor, respectively.

In particular, the gate of a power transistor is a capacitive load, and the turn ON current (i.e., gate source current) and the turn OFF current (i.e., gate sink current) are specified as the initial current when a switching event is initiated. During a turn OFF event, after some small amount of time (small compared to the PWM period), the gate current decreases and reaches a zero value when the gate reaches 0V. During a turn ON event, after some small amount of time (small compared to the PWM period), the gate current decreases and reaches a zero value when the gate reaches the high side supply level.

Transistors may include Insulated Gate Bipolar Transistors (IGBTs) and Metal Oxide Semiconductor Field Effect Transistors (MOSFETs) (e.g., Si MOSFETs or SiC MOSFETs). While IGBTs may be used as an example in the embodiments below, it will be appreciated that MOSFETs may be substituted for the IGBTs and vice versa. In this context, when substituting a MOSFET for an IGBT, a MOSFET's drain may be substituted for an IGBT's collector, the MOSFET's source may be substituted for the IGBT's emitter, and the MOSFETs drain-source voltage VDS may be substituted for the IGBT's collector-emitter voltage VCE in any one of the examples described herein. Thus, any IGBT module may be substituted by a MOSFET module and vice versa.

Specific embodiments described in this specification pertain to, without being limited thereto, a power semiconductor device that may be used within a power converter or a power supply. Thus, in an embodiment, the power semiconductor device may be configured to carry a load current that is to be supplied to a load and/or, respectively, that is provided by a power source. For example, the semiconductor device may comprise one or more power semiconductor cells, such as a monolithically integrated diode cell, and/or a monolithically integrated transistor cell. Such diode cell and/or such transistor cells may be integrated in a power semiconductor module.

Power semiconductor devices that include transistors which are suitably connected to form half-bridges are commonly used in the field of power electronics. For example, half-bridges may be used for driving electric motors or switched mode power supplies.

For example, a multi-phase inverter is configured to provide multi-phase power by supplying multiple phase loads (e.g., a three-phase motor). For instance, three-phase power involves three symmetrical sine waves that are 120 electrical degrees out of phase with one another. In a symmetric three-phase power supply system, three conductors each carry an alternating current (AC) of the same frequency and voltage amplitude relative to a common reference but with a phase difference of one third the period. Due to the phase difference, the voltage on any conductor reaches its peak at one third of a cycle after one of the other conductors and one third of a cycle before the remaining conductor. This phase delay gives constant power transfer to a balanced linear load. It also makes it possible to produce a rotating magnetic field in an electric motor.

In a three-phase system feeding a balanced and linear load, the sum of the instantaneous currents of the three conductors is zero. In other words, the current in each conductor is equal in magnitude to the sum of the currents in the other two, but with the opposite sign. The return path for the current in any phase conductor is the other two phase conductors. The instantaneous currents result in a current space vector.

A three-phase inverter includes three inverter legs, one for each of the three phases, and each inverter leg is connected to a direct current (DC) voltage source in parallel to each other. Each inverter leg includes a pair of power transistors, for example, arranged in a half-bridge configuration for converting DC to AC. In other words, each inverter leg includes two complementary transistors (i.e., a high-side transistor and a low-side transistor) connected in series and which switch on and off complementarily to the each other for driving a phase load.

Embodiments are directed to galvanically isolated gate driver system that include a single, discrete cored transformer to transfer both communication signals, including control signals, and power between a low-side chip and a high-side chip of the gate driver system. In this sense, the cored transformer can be regarded as providing a single transmission/reception channel (i.e., TX/RX channel) through which communication signals and power signals are transferred. Transfer of power may be regarded as unidirectional, from the low-side chip to the high-side chip. Whereas, transfer of communication signals may be regarded as bi-directional and can be performed in both directions between chips, although not simultaneously, of course.

Communication signals and power signals are allocated different time slots in order to transfer these different signal types across the single cored transformer. In particular, time division multiple access (TDMA) is an example allocation scheme (i.e., a transmission protocol) for allocating different time slots to communication signals and power signals.

According to the following embodiments, the cored transformer is configured to generate an isolated supply for providing power from the low-side chip to the high-side chip. Additionally, control circuitry in the low-side chip is provided to stop or interrupt the power transfer to allow for a fast data transfer burst between the low-side and high-side chips. Generally, the low-side chip is configured as the master in a master/slave configuration and the high-side chip is configured as the slave. As the master, the low-side chip located in the grounded, primary side (LV domain) is configured to stop the power transmission to the high-side chip to utilize the cored transformer for commination signal transmission. The control circuitry of the low-side chip may interrupt the power transfer when it is desired to transmit a communication signal from the low-side chip to the high-side chip. However, the high-side chip may also be configured with interrupt functionality to transmit an interrupt to the control circuitry of the low-side chip. In response to receiving this interrupt, the control circuitry of the low-side chip may interrupt the power transfer to enable a communication signal to be transmitted from the high-side chip to the low-side chip.

Accordingly, by using a cored transformer between two galvanically isolated gate diver chips, all high voltage isolation issues are moved to system level and outside the integrated circuits ICs (i.e., the chips) where it would be otherwise problematic and expensive to manage it.

The principle of using a single, discrete cored transformer to transfer both communication signals and power between two galvanically isolated chips may also be extended in a more general form to any system that exchanges a limited amount of digital data to and from an isolated (floating) voltage domain that also needs an isolated power supply. For example, the described embodiments may also be used in phase current sensors that include a floating analog-to-digital converter. A transformer with multiple secondary coils can also be used by introducing a handshaking in the transmission protocol.

FIG. 1 is a schematic block diagram of a multi-voltage domain system 100 according to one or more embodiments. In particular, the multi-voltage domain system 100 includes two galvanically isolated chips 10 and 20 with a cored transformer 30 therebetween that is used to transfer both communication signals and power between the two chips 10 and 20. The multi-voltage domain system 100 also includes two galvanically isolated chips 10 and 40 with a cored transformer 50 therebetween that is used to transfer both communication signals and power between the two chips 10 and 40.

The cored transformer 30 includes a two coils, a primary coil 31 and a secondary coil 32, linked by a ferromagnetic core 33 so the magnetic flux from coil one passes through the core 33 to the other coil. The cored transformer 30 provides a high-voltage barrier between chips 10 and 20. When the flux generated by one coil changes, the flux passing through the other coil will change, inducing a voltage in the second coil. The primary coil 31 includes two terminals E1 and A1 coupled to an input chip 10, with the voltage across the coil 31 being represented by Ve1-Va1. Similarly, the secondary coil 32 includes two terminals F1 and H1 coupled to a high-side chip 20 (i.e., an output chip), with the voltage across the coil 32 being represented by Vf1-Vh1. With AC power supplied to terminals E1 and A1, the voltage Vf1-Vh1 induced in the second coil will also be AC.

Similarly, cored transformer 50 includes a two coils, a primary coil 51 and a secondary coil 51, linked by a ferromagnetic core 53 so the magnetic flux from coil one passes through the core 53 to the other coil. The cored transformer 50 provides a high-voltage barrier between chips 10 and 30. When the flux generated by one coil changes, the flux passing through the other coil will change, inducing a voltage in the second coil. The primary coil 31 includes two terminals E2 and A2 coupled to the input chip 10, with the voltage across the coil 51 being represented by Ve2-Va2. Similarly, the secondary coil 52 includes two terminals F2 and 112 coupled to a low-side chip 40 (i.e., an output chip), with the voltage across the coil 52 being represented by Vf2-Vh2. With AC power supplied to terminals E2 and A2, the voltage Vf2-Vh2 induced in the second coil will also be AC.

The multi-voltage domain system 100 includes a low-side transistor 1 and a high-side transistor 2 that are controlled for supplying a load current ILOAD to a one phase of a load (not illustrated). The low-side transistor 1 is controlled by a low-side device 41 that includes a low-side (LS) gate driver used to drive the low-side transistor switch 1. The high-side transistor 2 is controlled by a high-side device 21 that includes a high-side (HS) gate driver used to drive the high-side transistor switch 2. Chips 10 and 20 are located in different voltage domains, e.g., a low-voltage domain and a high-voltage domain, respectively. In general, the low-side device 41 may be referred to as a low-side gate driver and the high-side device 21 may be referred to as a high-side gate driver.

Chips 10 and 40 may have a same voltage domain or different voltage domains. For example, both chips 10 and 40 may be supplied by a same voltage domain (i.e., same voltage potentials) may be supplied by different voltage domains (i.e., one or two different voltage potentials). However, in order to maintain galvanic isolation between chips 10 and 20, chips 10 and 40 also need to be isolated from each other by cored transformer 50. It will be appreciated that the structures for chip 40 and cored transformer 50 are in duplicate to the structures for chip 20 and cored transformer 30, with the exception of different supply voltage levels. thus, the description for chip 20 and cored transformer 30 and be similarly applied to chip 40 and cored transformer 50.

Both the low-side device 41 (e.g., the LS gate driver) and the high-side device 21 (e.g., the HS gate driver) perform gate driving of their respective power transistors 1 and 2 based on digital PWM signals LIN and HIN received from a microcontroller unit (MCU) 3. The PWM signals are control signals received from the MCU 3 at the low-voltage device 11. The low-voltage device 11 includes PWM logic that receives the LIN and HIN signals from the MCU 3 and ensures there is a minimum dead time implemented to prevent bridge shoot through. Eventually, the respective PWM control signals are passed on to the respective low-side and high-side gate drivers, where the PWM signal HIN is sent to the high-side gate driver and LIN is sent to the low-side gate driver. After this point, the low-side and high-side gate drivers perform gate driving.

Both gate drivers 41 and 21 include separate pre-driver circuitry and buffers. The pre-driver circuitries are configured to receive the PWM signals and, based thereon, control the on/off state of a respective first current source, such as a source FET, used to generate current Io+. Additionally, the pre-driver circuitries are configured to receive the PWM signals and, based thereon, control the on/off state of a respective second current source, such as a sink FET, used to generate current Io−. The respective current sources are provided in buffers. Thus, the buffers may each include a pair of complementary FETs used to generate turn-on currents Io+ and turn-off currents Io− for their respective power transistor 1 and 2. Each of the pre-driver circuitries may further command a respective buffer to use a certain current cap ability.

The low-voltage device 11 may be configured to receive PWM control signals HIN and LIN, from the MCU 3, and turn on or turn off respective transistors 1 and 2 in accordance with the received PWM control signals. For example, during the turn-on process of a respective transistor 1 or 2, the low-voltage device 11 may be used to provide (source) a gate current Io+ to the gate of the respective transistor 1 or 2 in order to charge the gate. In contrast, during the turn-off process, the low-voltage device 11 may be used to draw (sink) a gate current Io− from the gate of the transistor 1 or 2 in order to discharge the gate. Of course, when controlling the high-side transistor 2, control signals are transmitted from the low-voltage device 11 to the high-side device 21 via the cored transformer 30 and when controlling the low-side transistor 1, control signals are transmitted from the low-voltage device 11 to the low-side device 41 via the cored transformer 50.

Thus, the MCU 3 is electrically coupled to the low-voltage device 11 for the transmission of information signals and control signals HIN and LIN therebetween, and the gate driver system is electrically coupled to the inverter leg for driving the power transistors 1 and 2 thereof.

Specifically, the MCU 3 is configured to generate PWM control signals LIN and HIN for controlling the transistors 1 and 2, respectively, and transmit the control signals to the low-voltage device 11. For example, the low-voltage device 11 is configured to receive instructions from the MCU 3 to drive a load phase (i.e., an inverter leg) connected to voltage VS using the PWM control signals. These PWM control signals are received by the low-voltage device 11 at the LV domain (i.e., at input pins HIN and LIN) and passed through to the corresponding pre-driver circuitry via the appropriate logic. The buffers of each gate driver are configured to receive the PWM control signals and drive the corresponding power transistor 1 and 2 via output terminals HO and LO of the gate driver system.

In this example illustrated in FIG. 1, at least three regions are present including: a high-side region defined by a HV domain, a low-side region defined by a LV domain, and an isolation region defined by the cored transformers 30 and 50. The LV domain is a region that includes low-voltage devices and the HV domain is a region that includes high-voltage devices. For example, low-voltage devices may be supplied with 0-5V, while high-voltage devices may be supplied with over 100 volts (e.g., 120V-160V). The voltage domains are not limited to these voltage ranges, but are instead intended to provide an example of one implementation. Nevertheless, general principle of different voltage domain levels at different voltage hierarchies remains intact. The LV and HV regions are provided on separate, galvanically isolated dies (i.e., ICs).

The transformer 30 is configured to transmit electric signals (e.g., PWM control signals) from the low-voltage device 11 to the high-side device 21 (i.e., from a first voltage domain to a second voltage domain) or vice versa. Additionally, the transformer 30 is configured to transfer power from the low-voltage device 11 to the high-side device 21 (i.e., from a first voltage domain to a second voltage domain). Different time slots are allocated for transferring communication signals and power according to, for example, a TDMA protocol.

The transformer 50 is configured to transmit electric signals (e.g., PWM control signals) from the low-voltage device 11 to the low-side device 41 (i.e., from a first voltage domain to a same or different voltage domain, or vice versa. Additionally, the transformer 50 is configured to transfer power from the low-voltage device 11 to the high-side device 41 (i.e., from a first voltage domain to a same or different voltage domain). Different time slots are allocated for transferring communication signals and power according to, for example, a TDMA protocol.

Moreover, VB refers to the high-side floating supply voltage; VS refers to the high-side floating ground voltage; VDD or VCC refers to the low-side and logic fixed supply voltage; VSS or VEE refers to a low-side ground voltage; HO refers to the high-side floating output voltage; LO refers to the low-side output voltage; DC+ refers to DC-link positive; DC− refers to DC-link negative; and HIN and LIN refers to the logic input voltages (i.e., control signals) received from the MCU 3. VCC1 and VCC2 may be used to differentiate between two isolated low-side potentials. Likewise, VSS1 and VSS2 may be used to differentiate between two isolated low-side ground voltages.

Similarly, like terminals and voltages are intended to serve like purposes (e.g., E1/E2, A1/A2, F1/F2, H1/H2, Ve1/Ve2, Va1/Va2, Vf1/Vf2, Vh1/Vh2).

The high-side chip 20 includes a diode bridge 22 connected to and across the F1 and H1 terminals of the secondary coil 32. The diode bridge 22 rectifies the AC voltage Vf1-Vh1 into a DC voltage VB-VS where this energy is stored in a tank capacitor Ctank 23, which is located "off-chip" from or external to chip 20. The diode bridge 22 and the tank capacitor Ctank 23 form a power supply circuit on the secondary side where the power supply circuit receives and stores power received from the primary side and supplies the stored power to components of the chip 20. In particular, the power supply circuit receives the power signals, converts the power signals to stored energy, and supplies the stored energy to the components of the chip 20.

The low-side chip 40 includes a diode bridge 42 connected to and across the F2 and H2 terminals of the secondary coil 52. The diode bridge 42 rectifies the AC voltage Vf2-Vh2 into a DC voltage VCC2-VSS2 where this energy is stored in a tank capacitor Ctank 43, which is located "off-chip" from or external to chip 40. The diode bridge 42 and the tank capacitor Ctank 43 form a power supply circuit on the secondary side where the power supply circuit receives and stored power received from the primary side and supplies the stored power to components of the chip 40. In particular, the power supply circuit receives the power signals, converts the power signals to stored energy, and supplies the stored energy to the components of the chip 40.

The tank capacitor Ctank 23 is configured to supply the high-side floating supply voltage VB and the high-side floating ground voltage VS to the high-side device 21, and particularly, to the high-side gate driver, for turning on the high-side transistor switch 2. In particular, the tank capacitor Ctank 23 is charged by the low-voltage device 11, via the transformer 30 and the diode bridge 22, when the high-side transistor switch 2 is turned off and its source is grounded, e.g., during an interval in which a low-side transistor switch 1 is turned on. Once the high-side transistor switch 2 source is disconnected from ground, e.g., when the low-side transistor switch 1 is turned off, the tank capacitor Ctank 23 supplies power to the high-side gate driver as needed for turning on the high-side transistor switch 2.

The tank capacitor Ctank 43 is configured to supply the low-side fixed supply voltage VCC2 and the low-side ground voltage VSS2 to the low-side device 42, and particularly, to the low-side gate driver, for turning on the low-side transistor switch 1. In particular, the tank capacitor Ctank 43 is charged by the low-voltage device 11, via the transformer 50 and the diode bridge 42. The tank capacitor Ctank 43 provides a fixed supply VCC2-VSS2 to the low-side device 41. VSS2 may be coupled to DC−.

The high-side device 21 is further coupled (directly) to the two terminals F1 and H1 of the secondary coil 32 for receiving communication signals, including PWM control signals, therefrom. The high-side device 21 may also be configured to use terminals F1 and H1 to transmit communication signals, such as diagnostic signals or fault signals, thereto for transmission to the primary coil 31 and ultimately to the low-voltage device 11 and perhaps further to the MCU 3 coupled to the low-voltage device 11.

The low-side device 41 is further coupled (directly) to the two terminals F2 and H2 of the secondary coil 52 for receiving communication signals, including PWM control signals, therefrom. The low-side device 41 may also be configured to use terminals F2 and H2 to transmit communication signals, such as diagnostic signals or fault signals, thereto for transmission to the primary coil 51 and ultimately to the low-voltage device 11 and perhaps further to the MCU 3 coupled to the low-voltage device 11.

As will be explained in further detail below, the high-side device 21 may also trigger an interrupt to enable a transmission of a communication signal, such as a diagnostic signal or a fault signal, to the low-voltage device 11 and perhaps further to the MCU 3 coupled to the low-voltage device 11. For example, the low-voltage device 11 may be configured to relay a diagnostic signal or a fault signal to the MCU 3 via a feedback terminal FB. Based on the received diagnostic signal or a fault signal, the MCU 3 may adjust its PWM control signals HIN and LIN. For instance, the MCU 3 may change a duty cycle, a period, or the like of the PWM control signals HIN and LIN. In the case of a fault, the MCU 3 may turn off the high-side transistor switch 2 by driving PWM control signal HIN low until the fault is resolved.

Similarly, the low-side device 41 may also trigger an interrupt to enable a transmission of a communication signal, such as a diagnostic signal or a fault signal, to the low-voltage device 11 and perhaps further to the MCU 3 coupled to the low-voltage device 11. For example, the low-voltage device 11 may be configured to relay a diagnostic signal or a fault signal to the MCU 3 via a feedback terminal FB. Based on the received diagnostic signal or a fault signal, the MCU 3 may adjust its PWM control signals HIN and LIN. For instance, the MCU 3 may change a duty cycle, a period, or the like of the PWM control signals HIN and LIN. In the case of a fault, the MCU 3 may turn off the high-side transistor switch 2 by driving PWM control signal HIN low until the fault is resolved.

The high-side device 21 may trigger the interrupt by closing an interrupter switch 24 coupled across the terminals F1 and H1 of the secondary coil 32. The high-side device 11 may control the state of the interrupter switch 24 via a control signal SW1. The closed interrupter switch 24 shorts the terminals F1 and H1 together to the same potential (e.g., ground). The low-voltage device 11 may include a short-circuit detector that detects this short on the primary side that the low-voltage device 11 interprets as a transmission request from the secondary side (i.e., from the high-side device 21). In response, to the transmission request, the low-voltage device 11 can interrupt any primary side to secondary side transmission (either communication signal or power) to allow the high-side device 21 to send its communication signal.

Similarly, the low-side device 41 may trigger the interrupt by closing an interrupter switch 44 coupled across the terminals F2 and H2 of the secondary coil 52. The high-side device 11 may control the state of the interrupter switch 44 via a control signal SW2. The closed interrupter switch 44 shorts the terminals F2 and H2 together to the same potential (e.g., ground). The low-voltage device 11 may include a short-circuit detector that detects this short on the primary side that the low-voltage device 11 interprets as a transmission request from the secondary side (i.e., from the low-side device 41). In response, to the transmission request, the low-voltage device 11 can interrupt any primary side to secondary side transmission (either communication signal or power) to allow the low-side device 41 to send its communication signal.

In one example, the multi-voltage domain system 100 may be operated in a common mode of 130V with a floating supply having maximum operating range of 30V. In this example, VB operates at a maximum of 160V, VS operates at a maximum of 130V, VCC operates at 30V, and VSS operates at 0V. In particular, VS is equal to DC+ when transistor 2 is on (and transistor 1 is off) and equal to DC− when transistor 1 is on (and transistor 2 is off). In both cases, VB remains at substantially 30V above VS due to the tank capacitor Ctank 23. Thus, the low-side (external) supply voltage that supplies VCC may be set to 30V and the high-side supply voltage VB may be operated at a maximum voltage of 160V when DC+, equal to the common mode voltage, is 130V. DC− is tied to ground/VSS but does not have to be.

In another example, the multi-voltage domain system 100 may be operated in a common mode of 1500V with a floating supply having maximum operating range of 35V. In this example, VB operates at a maximum of 1535V, VS operates at a maximum of 1500V, VCC2 operates at 35V, and VSS operates at 0V. In particular, VS is equal to DC+ when transistor 2 is on (and transistor 1 is off) and equal to DC− when transistor 1 is on (and transistor 2 is off). In both cases, VB remains at substantially 35V above VS due to the tank capacitor Ctank 23. Thus, the low-side supply voltage that supplies VCC2 may be set to 35V and the high-side supply voltage VB may be operated at a maximum voltage of 1535V when DC+, equal to the common mode voltage, is 1500V. DC− is tied to ground/VSS2 but does not have to be.

It will be appreciated that the common mode voltage and the maximum operating range of the floating supply is configurable and may set at different voltages provided in the above two examples, including common mode voltages between 130-1500V, less than 30V, or greater than 1500V. The aforementioned voltages are set such that the high-side voltage domain operates in a higher voltage or power domain than that of the low-side voltage domain.

Figure 2:
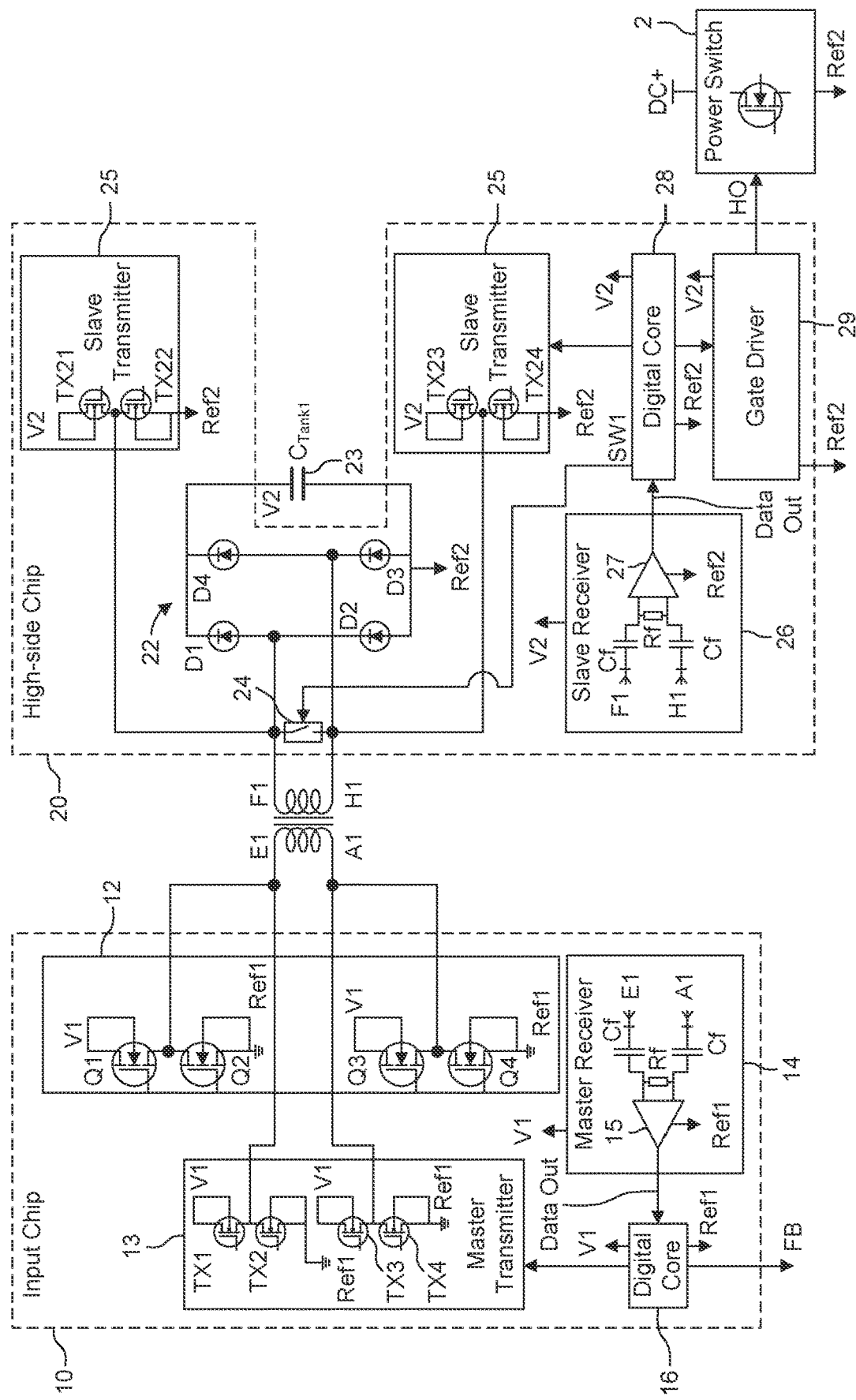
FIG. 2 is a schematic diagram of a bidirectional communication system of the multi-voltage domain system according to one or more embodiments.

FIG. 2 is a schematic diagram of a bidirectional communication system of the multi-voltage domain system 100 according to one or more embodiments. However, it will be appreciated that the use of the bidirectional communication system can be extended in a more general form to any system that exchanges a limited amount of digital data to and from an isolated (floating) voltage domain that also needs an isolated power supply. Furthermore, while FIG. 2 is directed to transmissions to/from the high-side chip 20 using transformer 30, the disclosed transmission principles can be similarly applied to transmissions to/from the low-side chip 40 using transformer 50.

A low-to-high side transmission may be referred to as a primary-to-secondary side transmission or an uplink transmission, whereas a high-to-low side transmission may be referred to as a secondary-to-primary side transmission or a downlink transmission.

In FIG. 2, circuitry is shown for explaining the transmission of communication signals and power between the two chips 10 and 20 using the cored transformer 30. The LV domain is defined by supply voltage V1 (e.g., VCC1) and reference voltage Ref1 (e.g., ground or VSS1) and the HV domain is defined by floating supply voltage V2 (e.g., VB) and floating reference voltage Ref2 (e.g., VS).

Figure 3:
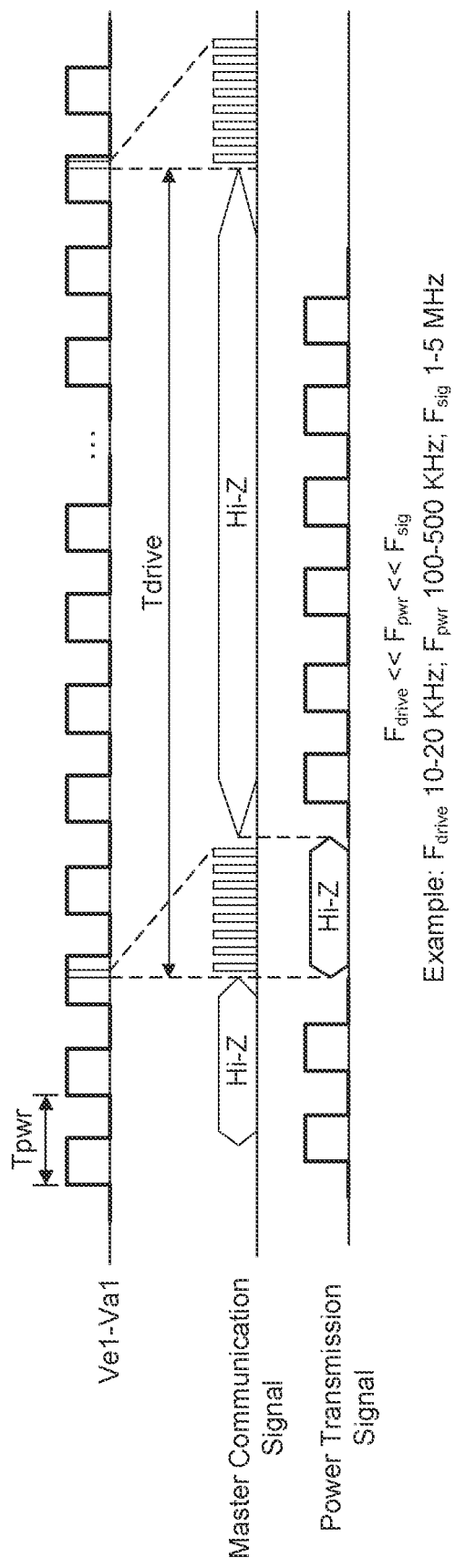
FIG. 3 is a timing diagram for master communication signals and power transmission transferred from a primary side to a secondary side in accordance with the multi-voltage domain system according to one or more embodiments.

FIG. 3 is a timing diagram for master communication signals (i.e., those communication signals being transmitted from the low-voltage device 11 to the high-side device 21) and power transmission transferred from the low-voltage device 11 to the high-side device 21 in accordance with the multi-voltage domain system 100. The timing diagram will be described in conjunction with the description directed to FIG. 2. Multiple bits can be transmitted during a data transmission period.

As noted above, input chip 10 behaves as a master device, while the high-voltage, high-side chip 20 behaves as a slave device. The two chips 10 and 20 have a common structure for signal management, while they differ in energy transfer functionality. In particular, the master device is configured to transfer the energy to secondary side of the transformer 30, while the slave device has the function to properly store this energy in the tank capacitor Ctank 23, as described above.

The energy management blocks and their presence in either low/high side chips 10 and 20 include a power transmission bridge 12 in the input chip 10, a data transmission bridge 13 (i.e., master transmitter) in the low-voltage chip 10, a data transmission bridge 25 (i.e., slave transistor) in the high-side chip 20, a data transmission receiver 14 (i.e., master receiver) in the input chip 10, a data transmission receiver 26 (i.e., slave receiver) in the high-side chip 20, a digital core 16 in the input chip 10 that includes processing and/or control circuitry, a digital core 28 in the high-side chip 20 that includes processing and/or control circuitry, and a high-side gate driver 29 in the high-side chip 20 that drives the power transistor 2 based on control signals received from the digital core 28. The diode bridge 22, including four diodes D1-D4, the tank capacitor Ctank 23, and the interrupter switch 24 are also shown in accordance with the above description.

Circuitries 12, 13, and 14 may be integrated in the low-voltage device 11 shown in FIG. 1, meanwhile circuitries 22, 24, 25 and 26 may be integrated in the high-side device 12 also shown in FIG. 1. The tank capacitor Ctank 23 is connected to but is provided external to the high-side chip 20. It is connected to the output of the diode bridge 22, stores energy provided by the diode bridge 22, and further supplies voltages V2 and Vref2 to the circuitries of the high-side chip 20.

It is noted that bridges 12, 13, and 25 are full bridge circuits each comprising four transistors. Specifically, the power transmission bridge 12 is a full bridge comprising transistors Q1, Q2, Q3, and Q4, the data transmission bridge 13 is a full bridge comprising transistors TX1, TX2, TX3, and TW4, and the data transmission bridge 25 is a full bridge comprising transistors TX21, TX22, TX23, and TW24.

Additionally, the data transmission receiver 14 includes two input terminals coupled to the two terminals E1 and A1 of the primary coil for receiving voltage potentials therefrom, the difference of which can be decoded as a data signal. Likewise, the data transmission receiver 26 includes two input terminals coupled to the two terminals F1 and H1 of the secondary coil for receiving voltage potentials therefrom, the difference of which can be decoded as a data signal.

The power transmission provided by the power transmission bridge 12 and the data transmission provided by the data transmission bridge 13 operate in a complementary way according to, for example, a TDMA protocol and they are never on at the same time. The power transmission bridge 12 has the purpose to transfer energy from the primary supply V1 to the tank capacitor Ctank 23. The data transmission bridge 13 has the purpose of transferring digital information from the input chip 10 to the high-side chip 20 or, more generally, to the secondary side of the transformer 30. The data transmission bridge 25 has the same purpose for data transmission in the opposite direction, and, particularly, for sending digital information from the high-side chip 20 to the input chip 10.

The data transmission bridges 13 and 25 may use smaller output switches (e.g., MOSFETs) than the power transmission bridge 12. This would help to increase the transmission frequency for data transmissions while maintaining a reduced power dissipation during data transmissions.

The timing diagram of FIG. 3 shows a voltage signal Ve1-Va1 across the primary coil 31. The voltage signal Ve1-Va1 is a square wave that switches between a low state and a high state with a period Tpwr. A data signal and a power signal originating from the input chip 10 are also shown, each having time intervals of transmission and time intervals of high impedance (Hi-Z) during which its transmission is blocked. Specifically, the bridges 12, 13, and 25 are kept in a high impedance condition while they are not switching. The time intervals of high impedance (Hi-Z) are complementary to each other with respect to the data signals and the power signals such that the data signals and the power signals are allocated different time slots for transmission across the channel formed by the transformer 30.

During a power transmission interval, the power signal has a frequency Fpwr=1/Tpwr. Thus, the frequency of the power signal matches the frequency of the voltage signal Ve1-Va1. On the other hand, during a data transmission interval, the data signal has a frequency Fsig=1/Tsig, where the period of the data signal Tsig is smaller than the period Tpwr. As a result, the frequency Fsig of the data signal is higher than the frequency Fpwr of the power signal. In addition, the data transmission bridge 13 communicates to the data transmission receiver 26 with a frequency Fdrive=1/Tdrive, where Tdrive is the drive period or interval that spans a start of a data transmission interval and an end of the adjacent high-impedance (Hi-Z) interval. Said differently, Tdrive is the time interval that spans a start of a data transmission interval and a start of a next data transmission interval. In order to ensure a proper functionality, the following relationship should be respected:

$$F\text{drive} < F\text{pwr} < F\text{sig} \qquad (1)$$

For instance, Fdrive may be set to 25 kHz, Fpwr may be set to 250 kHz, and Fsig may be set to 2.5 MHz as merely one example.

Said differently, the length of the time slots allocated to the power signal is larger than the length of the time slots allocated to the data signal, and the data signal has a higher frequency (Hz) than the frequency (Hz) of the power signal. The time slots allocated to the power signal are interleaved with the time slots allocated to the data signal. The drive period defined by a length of two consecutive time slots (one allocated to a power signal and one allocated to a data signal) is greater than a period of the power signal (Tpwr=1/Fpwr) and the period of the power signal is greater than a period of the data signal (Tsig=1/Fsig).

Each data receiver 14 and 26 is composed by a high-pass filter comprising two filter capacitors Cf and a filter resistor Rf. The high-pass filter is tuned to reject the power transmission frequency Fpwr and sense the data transmission frequency Fsig (e.g., in the 1-10 MHz range, depending on the transformer bandwidth). Thus, setting the respective frequencies according to equation (1) enables the high-pass filters to discriminate between power signals and data signals, and allow the data signals to pass through while attenuating the power signals. The receiver 14 is configured to demodulate a digital signal received at pins E1 and A1, whereas receiver 26 is configured to demodulate a digital signal received at pins F1 and H1.

Each data receiver 14 and 26 further includes a comparator 15 and 27, respectively, that demodulates the received data signal by converting the signal defined at the output terminals of the high-pass filter (or defined at the input terminals of the comparator 15, 27) into a digital (differential) signal representative of a bit value of a data signal.

A data signal is output from an output (data out) terminal of the comparator 15 at receiver 14 and is provided to the digital core 16. The digital core 16 may provide the data decoded from the digital signal as feedback information FB to the microcontroller 3.

Similarly, a data signal is output from an output (data out) terminal of the differential amplifier 27 at receiver 26 and is provided to the digital core 28. The data signal may be a control signal representative of the PWM control signal HIN for turning on/off the power transistor 2. The data signal may also include other information, including, but not limited to, the strength of the current to be supplied to the gate (i.e., the magnitudes for currents IO+ and IO−), bias configuration, and an undervoltage-lockout (UVLO) detection voltage (i.e., a voltage value to be used as a threshold for UVLO detection).

When a data transmission from the low-voltage side to the high-voltage side is needed (e.g., in a gate driver, for controlling a change in the state of the high-side transistor switch 2), the power transmission bridge 12 is turned off (high impedance) and after a delay period, the data transmission bridge 13 is activated to perform a serial communication using a transmission protocol. The data transmission receivers 14 and 26 are always active. A data transmission must use a master-slave configuration, due to the nature of the input chip 10 that manages the transfer of energy from the input chip 10 to the high-side chip 20.

The high-voltage side to low-voltage side data transmission (i.e., a secondary-to-primary side transmission) can happen only after a low-to-high side (i.e., a primary-to-secondary side transmission) data transmission or when an interrupt is triggered by control signal SW1 using the interrupter switch 24. This does not represent an impacting characteristic because the high-to-low side data is usually represented by diagnostic signals (e.g., undervoltage-lockout (UVLO) and desaturation (DESAT)) that can be postponed.

In case it is necessary to send a more critical diagnostic signal or fault signal (e.g., fast diagnosis detection), the interrupt provides an option to not wait for a low-to-high side data transmission in order to send a high-to-low side data transmission. The digital core 28 generates the control signal SW1, for example, in response to detecting a fault condition, to control the state of the interrupter switch 24. When closed, the interrupter switch 24 shorts the F1 and H1 terminals of the secondary coil 32 to the same potential (e.g. ground). This can trigger a short circuit detection in the primary side that is then interpreted as a transmission request by the master receiver 14. In particular, the comparator 15 detects the short circuit via terminals E1 and A1 and outputs a short circuit detection signal to the digital core 16. The digital core 16 then interrupts a current transmission (i.e., the power transmission bridge 12 and the data transmission bridge 13 are both turned off (high impedance)) to allow for a data transmission from the high-side chip 20 to the input chip 10.

The high-to-low side data signal can be also used to generate a closed loop (discrete time) secondary supply. In fact, the high-side chip 20 on the secondary floating side can sense, convert in digital, and feed the voltage level of its supply back to the input chip 10 on the primary side. The power transmission bridge 12 can then be controlled by the digital core 16 to adapt its power transmission frequency to the state of charging of the tank capacitor Ctank 23 in order to limit power dissipation and improve electromagnetic interference (EMI) performances.

Accordingly, the cored transformer 30 is used both to generate a floating voltage supply for the high-side chip 20 by transferring energy from the input chip 10 to the high-side chip 20 and also as a bidirectional digital data transmission channel for data transmissions between chips 10 and 20 in an isolated gate driver. As a result, there is no need to integrate a high voltage isolation barrier inside a chip, but instead such an isolation can be provided at the system level between two chips. This results is a simpler design, less external components, and lower manufacturing costs due to the avoidance of a costly on-chip isolation process.

Figure 4:
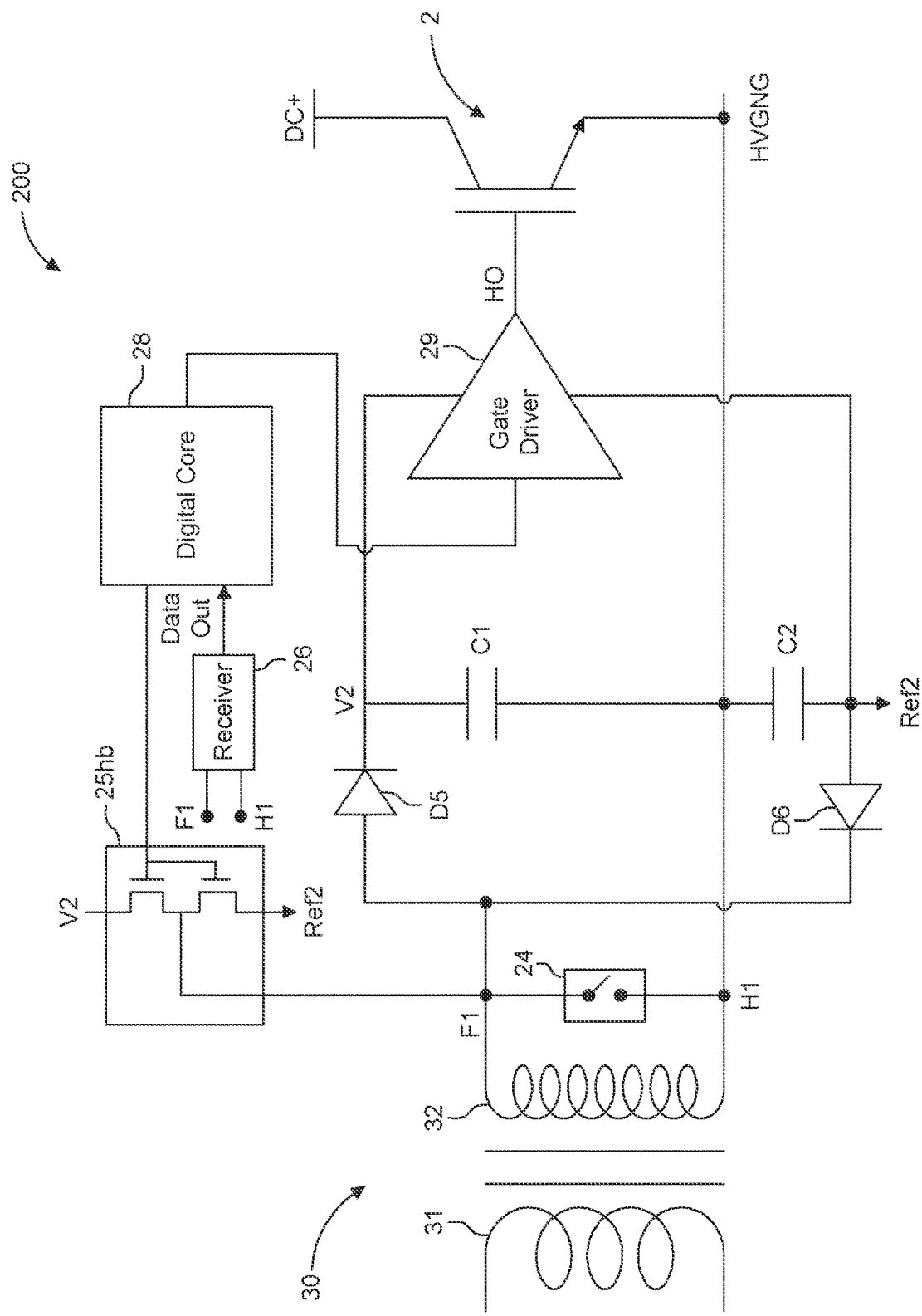
FIG. 4 shows a schematic diagram of high-side circuitry according to one or more embodiments.

FIG. 4 shows a schematic diagram of high-side circuitry 200 according to one or more embodiments. In particular, the high-side circuitry 200 is an alternate configuration to the high-side circuitry shown in FIGS. 1 and 2. The high-side circuitry 200 includes a bipolar supply for supplying power to the gate driver 29.

Here, the secondary side (i.e., the high-side chip 20) is configured in order to guarantee a bipolar biasing of the high-side gate driver (e.g. +15, −5V) as it is common in high power IGBTs, GaN, and SiC power switches. In this case, since one of the terminals (i.e., terminal H1) of the secondary coil 32 is fixed as the "central ground" HVGND, only a half-bridge transmitter 25hb can be used as the high-to-low side data transmitter for data transmission to the input chip 10. The central ground voltage HVGND is 0V. Diodes D5 and D6 are provided to rectify the voltage received at terminals F1 and H1 of the secondary coil 32. tank capacitors C1 and C2 are provided as a voltage divider to generate supply voltages V2 and Ref2, as well as the maintain the central ground voltage HVGND at 0V.

This particular arrangement can be used when voltage V2 is to be applied to the gate of the transistor 2 having an emitter as a reference to turn on the transistor 2, and voltage Ref2 is to be applied to the gate of the transistor 2 having its emitter as reference to turn it off. In other words, the gate of transistor 2 is driven by a negative voltage (Ref2) compared to its emitter to turn the transistor 2 off.

The high-to-low side data signal can be also used to generate a closed loop (discrete time) secondary supply. In fact, the high-side chip 20 on the secondary floating side can sense, convert in digital, and feed the voltage level of its supply back to the input chip 10 on the primary side. The power transmission bridge 12 can then be controlled by the digital core 16 to adapt its power transmission frequency to the state of charging of the tank capacitors C1 and C2 in order to limit power dissipation and improve electromagnetic interference (EMI) performances.

In a gate driver system, there is a small delay (e.g., 100 ns or greater) from the time a PWM control signal HIN or LIN is received at the input chip 10 and a time that information is transmitted across the cored transformer to the appropriate gate driver (e.g., gate drier 29 for the high-side switch 2) for turning on/off the power transistor. For example, there is a delay between the external command HIN being received at the input chip 10 from the MCU 3 and the high-side transistor switch 2 effectively turning on or off in response to that command HIN. Once the power transmission is stopped to permit data transmission of the control signal, the transformer current of transformer 30 needs some time to drop to zero mainly due to parasitic leakage inductance. During this period, the diodes D1 and D3 or diodes D2 and D4 (which two diodes depends on the configuration on the primary side and depending on the energy in the leakage inductance) on the secondary side are still on, thus shorting any transmission signal to a low impedance signal short (tank capacitor Ctank 23). Under this condition, the data transmission could be affected due to the damping effect of the tank capacitor Ctank 23. This delay may be negligible to the extent it could be ignored. However, three additional solutions are provided if this delay becomes too large or if it is desired to decrease the transmission delay.

First, once the digital core 16 detects the interrupt command triggered by the closing of the interrupter switch 24, the power transmission bridge 12 is turned off by the digital core 16 to stop the power transmission. Upon triggering the interrupt command at the interrupt switch 24, the digital core 28 the high-side is configured to wait for a predetermined amount of time before starting its data transmission using transmitter 25. The predetermined amount of time is set to at least a maximum time period required for the leakage inductance through the secondary coil 32 to discharge. In this case, the delay is accepted and know.

Second, the digital core 16 could act with a predictive signal by stopping the power transmission in advance by turning off the power transmission bridge 12 in order to compensate for the leakage inductance delay. Typically, the signal delay is known (e.g., 1 μs). So, the digital core 16 can stop the power transmission, for example, 1 μs earlier (in advance) to account for the delay.

Third, during a data transmission idle time during which the transmitters 13 and 25 are set to high impedance, the input chip 10 is transmitting only power using a square wave a fixed frequency Fpwr. A phase-locked loop (PLL) in the high-side chip 20 can be implemented to generate a precise replica in frequency and phase of the square wave used to transmit power to the high-side chip 20. The locking of this PLL should happen before effective switching of the high-side gate driver, during the startup of the power supply in the high-side chip 20. Further embodiments will elaborate on the PLL arrangement for performing data fast data transmissions across a cored transformer implemented in a gate driver system.

Figure 5:
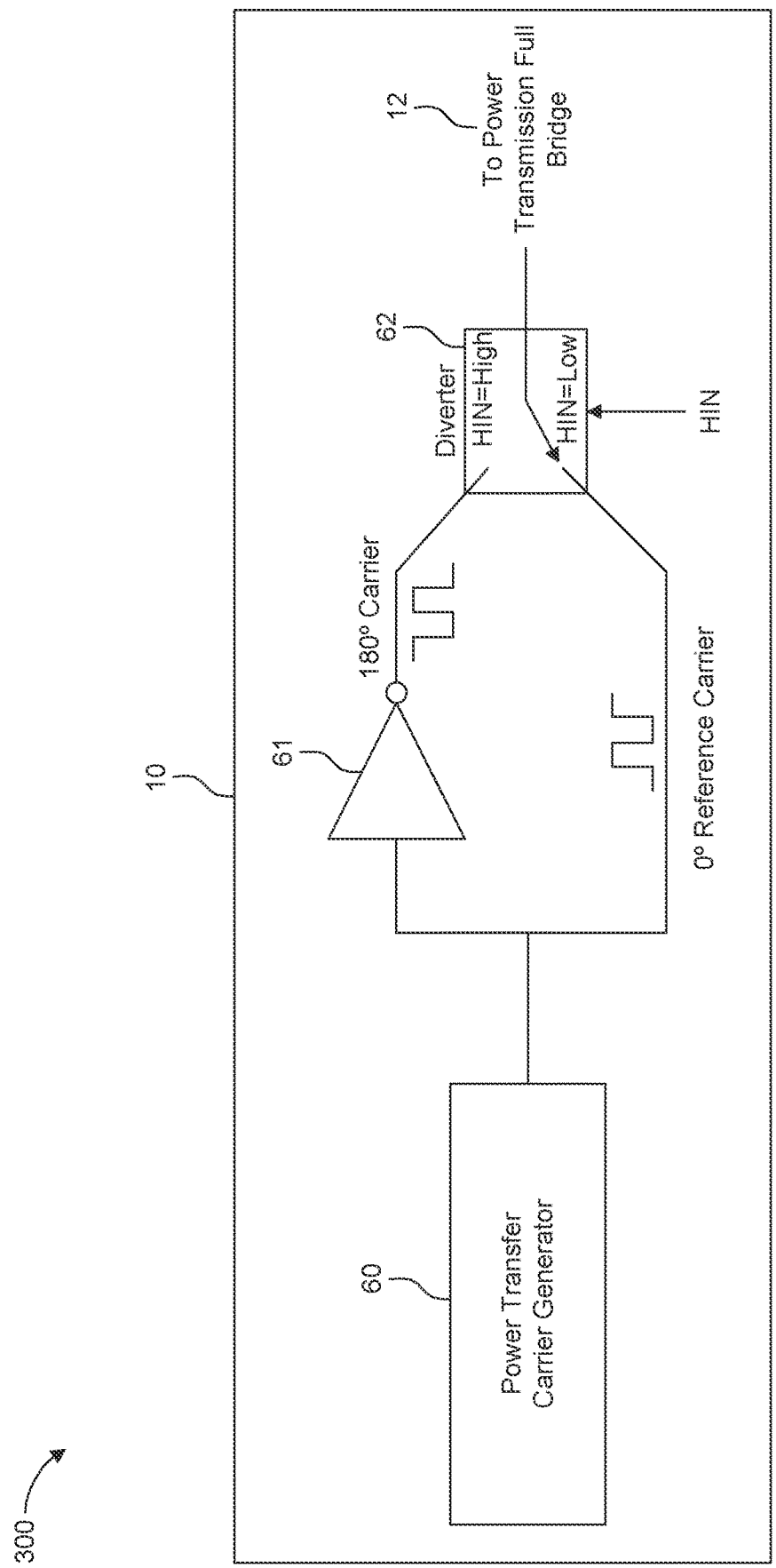
FIG. 5 is a schematic diagram of a data transmission system provided on a primary side of a cored transformer as part of a phase-locked loop (PLL)-based communication system according to one or more embodiments.
Figure 6:
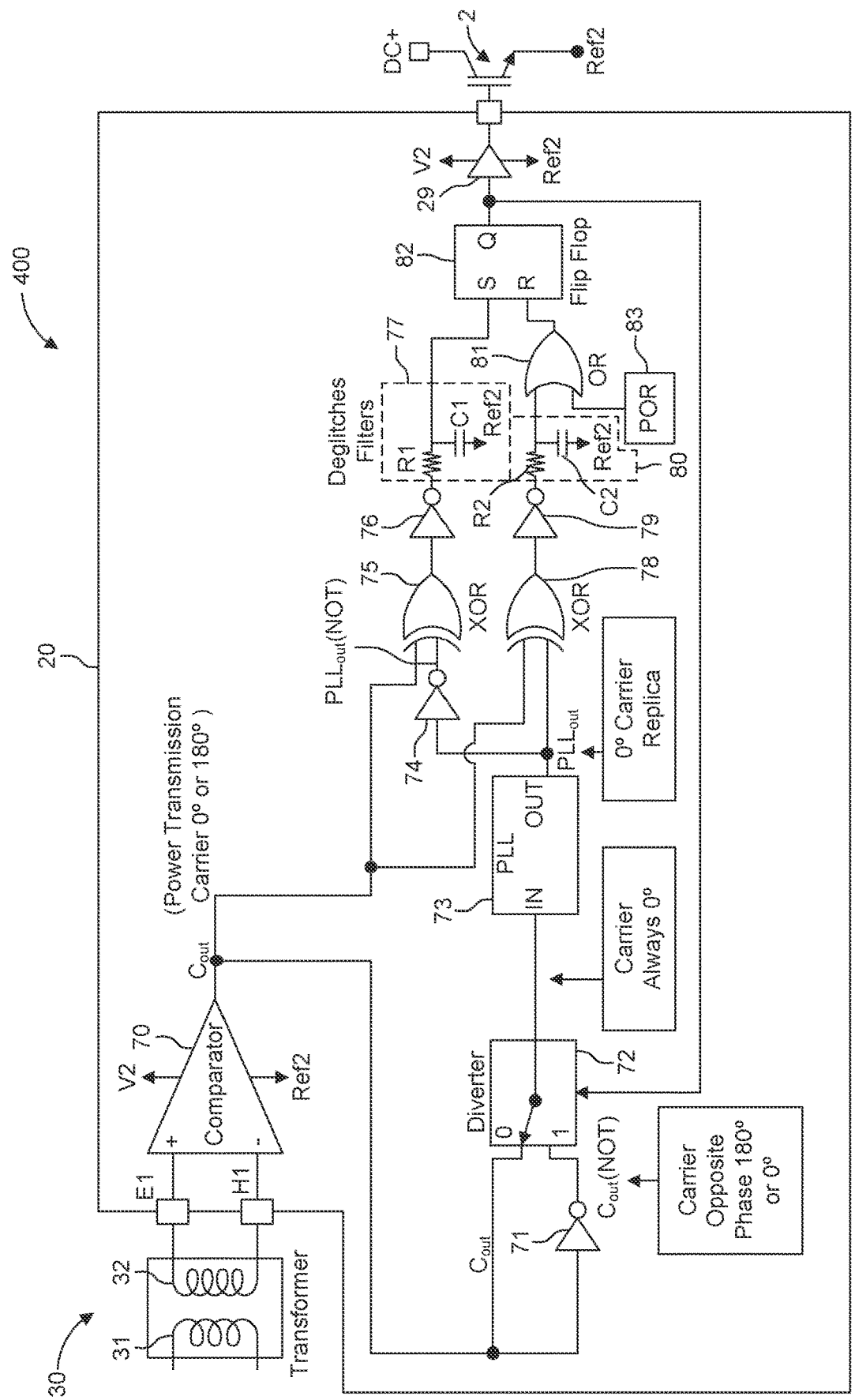
FIG. 6 is a schematic diagram of another data receiver system provided on the secondary side of a cored transformer as part of the PLL-based communication system according to one or more embodiments.

FIG. 5 is a schematic diagram of another data transmission system 300 provided on a primary side of a cored transformer according to one or more embodiments. FIG. 6 is a schematic diagram of another data receiver system 400 provided on the secondary side of a cored transformer according to one or more embodiments. The data transmission system 300 is configured to operate with the data receiver system 400 to transmit information to the data receiver system 400. Specifically, systems 300 and 400 form a PLL-based communication system.

The data transmission system 300 is configured to transmit information from the LV domain (i.e., from the input chip 10) across a cored transformer to a chip connected to the secondary side of the cored transformer. The data transmission system 300 is configured for fast transmission of a single bit by changing the phase of a power carrier signal.

The data transmission system 300 include a stable power transfer carrier generator 60 (i.e., an oscillator with fixed frequency usually in the 50-700 KHz range) generates a square wave as a reference power carrier signal with reference phase, here defined as 0°. An inverter 61 (e.g., a complementary metal-oxide-semiconductor (CMOS) inverter or NOT gate) having negligible delay generates a 180° phase-shifted power carrier signal having an (inverted) 180° phase with respect to the reference power carrier signal. Both the reference power carrier signal and the phase-shifted power carrier signal are provided to a diverter 62 that further receives the PWM control signal HIN from the microcontroller 3. It is noted that for transmitting to the low-side chip 40, the PWM control signal LIN would be used.

The diverter 62 is configured to couple the reference power carrier signal or the phase-shifted power carrier signal to the power transmission bridge 12 (see FIG. 2) based on the PWM control signal HIN. For example, when the PWM control signal HIN is high, the diverter 62 selectively couples the phase-shifted power carrier signal to the power transmission bridge 12 in order to turn on the power transistor 2. Alternatively, when the PWM control signal HIN is low, the diverter 62 selectively couples the reference power carrier signal to the power transmission bridge 12 in order to turn off the power transistor 2. Thus, the diverter 62 is configured to encode data (e.g., a single data bit) onto the power signal coupled to the primary coil 31 based on whether the reference power carrier signal or the phase-shifted power carrier signal is selected.

The coupled carrier signal is provided to the gates of the transistors Q1-Q4 of the power transmission bridge 12, and the power transmission bridge 12 generates a power signal based on the coupled carrier signal (i.e., based on either the reference power carrier signal or the phase-shifted power carrier signal). The data receiver system 400 is configured to detect the phase of the coupled in power carrier signal to determine whether a turn on command (i.e., a turn on bit) is transmitted or a turn off command (i.e., turn off bit) is transmitted by the power transmission bridge 12. The power transistor 2 may then be turned on/off according to the received commands while power is still transferred to the secondary side of the cored transformer 30.

The power transmission bridge 12 is driven by original phase 0° carrier when input is low (meaning power switch in the high side OFF) and by 180° phased one whenever input is high (meaning power switch ON). During the system startup for a fixed period of time (i.e., an initialization period), the power transmission bridge 12 is driven only by the 0° reference power carrier signal despite the HIN input status. That is, the diverter 62 is fixed to the reference power carrier signal and does not respond to the PWM control signal HIN during the initialization period. This fixed time period is determined by the need of establishing a stable supply for the high-side chip 20 plus a time interval used by the PLL in the high-side chip 20 to get a precise and stable locking condition with the 0° reference power carrier signal. Once the initialization period has lapsed, the diverter 62 responds to the PWM control signal HIN by selectively coupling either the reference power carrier signal or the phase-shifted power carrier signal to the power transmission bridge 12.

It is noted that the power transfer carrier generator 60 may also be implemented in the input chip 10 shown in FIG. 2 to generate the power transmission signal as a square wave that is directly coupled to the transistors Q1-Q4 of the power transmission bridge 12.

The data receiver system 400 shown in FIG. 6 is configured to receive information from the LV domain (i.e., from the input chip 10) via power transmission signal. The data receiver system 400 may be used in conjunction with the power transmission portion of system 100 that uses the power transmission signal to generate the supply voltages V2 and Ref2. Specifically, while not shown, the diode bridge 22 and the tank capacitor Ctank 23 may be coupled to terminals E1 and H1 of the secondary coil 32, as previously described in conjunction with FIG. 2, for providing supply voltages V2 and Ref2 to the components of the high-side chip 20. In this case, the reference power carrier signal and the phase-shifted power carrier signal are used at power transmission signals, both of which charge the tank capacitor Ctank 23. The difference here is that the power transmission signals are used synchronously to transmit a data bit to control the state of the power transistor 2.

The transformer outputs F1 and H1 of the secondary coil 32 are converted into a square wave by a low delay comparator 70 whose output Cout is a replica of the power transmission carrier frequency of the received power transmission carrier signal. In particular, the output Cout of the comparator 70 is more like a square wave, whereas the input of the comparator 70 is noisy and does not clearly defined upper and lower levels. The comparator 70 sets the signal to the proper digitals levels which change (alternate) according to the power transmission carrier frequency. The comparator output Cout has the same phase (0° or 180°) as the power carrier signal that is coupled in by diverter 62 to drive the transformer primary side (i.e., the same phase as either the reference power carrier signal or the phase-shifted power carrier signal).

The data receiver system 400 includes a flip-flop 82 that is used to store the status (ON-OFF) of the power transistor 2, driven through a gate driver 29. The output (Q) of the flip-flop 82 is set high (1 logic state) via SET (S) input when the phase-shifted power carrier signal is received at the secondary coil 32 and the output (Q) of the flip-flop 82 is set low (0 logic state) via the RESET (R) input when the reference power carrier signal is received at the secondary coil 32. This memory unit is RESET dominant. In other words, if SET and RESET commands are simultaneously present, the flip-flop 82 is in the RESET state. The flip-flop 82 is initialized at system start-up during the initialization period at the 0 logic state (i.e., transistor 2 is off) by the power on reset (POR) circuit, which provides a high POR signal to OR gate 81. The OR gate 81 generates a high signal in response to the high POR signal, which pulses the RESET input of the flip-flop 82 and keeps the transistor 2 off. Once the initialization period has lapsed, the POR circuit provides a low POR signal to the OR gate 81, thereby allowing the output of the OR gate 81 to be controlled by its other input terminal.

The data receiver system 400 further includes an inverter 71 (e.g., a CMOS inverter or NOT gate) and a diverter 72 that selectively switches between two inputs based on the output (Q) of flip-flop 82. The inverter 71 receives and inverts the comparator output Cout to generate Cout(NOT). Thus, Cout(NOT) always has the opposite phase, inverted by 180°, of the power transmission carrier signal. The diverter 72 is selectively coupled to the comparator output Cout when the output (Q) of the flip-flop 82 is low and is selectively coupled to Cout(NOT) when the output (Q) of the flip-flop 82 is low.

During the initialization period, the flip-flop 82 is in the RESET state and the diverter 72 connects the comparator output Cout to the input of the PLL 73 so that the PLL 73 itself is able to obtain a stable locking with the 0° reference power carrier signal.

Based on the input selection made by the diverter 72, the output of the diverter 72 always has a 0° phase. For example, the 0° reference power carrier signal is provided to the secondary side when the transistor 2 is to be off, meaning the output of the flip-flop 82 is low and the comparator output Cout with a 0° phase replica of the 0° reference power carrier signal is coupled to the PLL 73. In contrast, the 180° phase-shifted power carrier signal is provided to the secondary side when the transistor 2 is to be on, meaning the output of the flip-flop 82 is high and the inverted comparator output Cout(NOT) with an inverted phase of the 180° phase-shifted power carrier signal is coupled to the PLL 73. The inverted phase of 180° is 0°. Thus, Cout(NOT) having a 0° phase is coupled to the PLL 73 in this instance. Accordingly, the PLL 73 remains locked with a 0° power carrier signal and outputs a 0° phase carrier replica signal PLLout.

An inverter 74 (e.g., a CMOS inverter or NOT gate) is connected to the PLL output PLLout to generate an inverted (180° phase replica) of PLLout in the form of PLLout (NOT).

The PLL output PLLout (0° phase replica) and the inverted (180° phase replica) PLLout(NOT) are given as inputs to a two-phase discriminator comprising XOR 75, inverter 76 (e.g., a CMOS inverter or NOT gate), deglitch filter 77, XOR 78, inverter 79 (e.g., a CMOS inverter or NOT gate), and deglitch filter 80. An XOR and NOT gate (inverter) could also be replaced by an XNOR gate. The two-phase discriminator is configured to discriminate the phase of the comparator output Cout and set the state of the flip-flop 82 accordingly (Q set high if Cout has a 0° phase and Q set low if Cout has a 180° phase). The flip-flop 82 decodes the determined phase of a power signal received at the secondary coil 32 into a corresponding bit value, logic 1 or logic 0. Accordingly, the flip-flop is a bit decoder configured to extract the encoded bits based on the determined phase of the power signals relative to a phase of the PLL output signal PLLout.

An XOR generates a low (logic 0) output when both of its inputs are the same, and a high (logic 1) output when both of its inputs are different. Thus, XOR 75 generates a low output when the phase of Cout is 180°, indicating that the phase-shifted power carrier signal was transmitted to turn on the transistor 2. The inverter 76 converts this low output to a high output (logic 1) in order to SET flip-flop 82. In contrast, XOR 78 generates a low output when the phase of Cout is 0°, indicating that the reference power carrier signal was transmitted to turn off the transistor 2. The inverter 79 converts this low output to a high output (logic 1) in order to RESET flip-flop 82. Thus, the two-phase discriminator is able to determine whether the power carrier transmitted received from the low side is in phase with the PLL output PLLout at 0° phase or is in phase with the 180° carrier replica PLLout(NOT) generated by a low delay inverter 74 applied to the PLL output PLLout. The flip-flop 82 decodes the determined phase of a power signal received at the secondary coil 32 into a corresponding bit value, logic 1 or logic 0. Accordingly, the flip-flop is a bit decoder configured to extract the encoded bits based on the determined phase of the power signals relative to a phase of the PLL output signal PLLout.

The system is fully synchronous, so only the 0° and 180° phases are possible. However, slight misalignments in the rise and fall edges of PLLout and PLLout(NOT) are possible, generating glitches at the outputs of XORs 75 and 78. The glitches can be removed at a cost of few nanosecond delay by a low-pass deglitch filter 77 and 80. The deglitch filters 77 and 80 each include a resistor (R1 or R2) and a capacitor (C1 or C2) coupled in a low-pass filter configuration. The deglitch filter 77 filters out sharp glitch pulses that result from a short misalignment in falling edges and/or rising edges of Cout and PLLout(NOT). The deglitch filter 80 filters out sharp glitch pulses that result from a short misalignment in falling edges and/or rising edges of Cout and PLLout.

Figure 7:
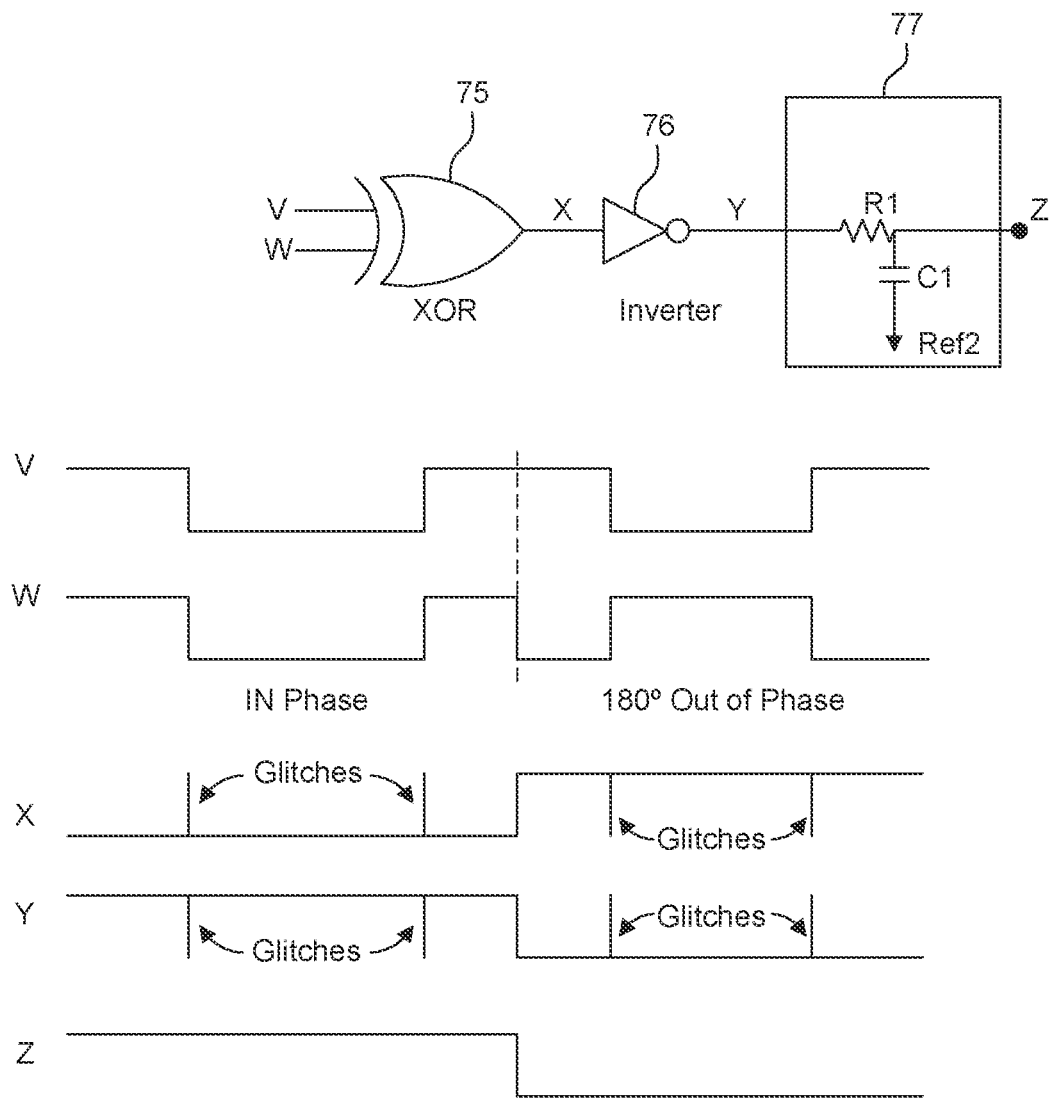
FIG. 7 is a signal diagram of signals at various nodes located along part of a two-phase discriminator of a data receiver system according to one or more embodiments.

FIG. 7 is a signal diagram of signals at various nodes located along part of the two-phase discriminator of FIG. 6. In particular, signals at nodes V, W, X, Y, and Z are shown, with the signal at node V being Cout and the signal at node W being PLLout(NOT). If the carrier phase from low-voltage side is 180°, the SET is activated at flip-flop 82. The deglitch filter 77 removes any glitch pulses that may occur due to a short misalignment in falling edges and/or rising edges of Cout and PLLout(NOT).

Circuit elements XOR 78, inverter 79, and deglitch filter 80 operate in a similar manner with the signal at node V being Cout and the signal at node W being PLLout. In that case, if the transmission carrier has 0° phase the RESET of the flip-flop 82 is active (set high through the OR gate 81). As noted above, the diverter 72 is driven by the flip-flop state so that the PLL input of PLL 73 always sees a 0° phase.

Figure 8:
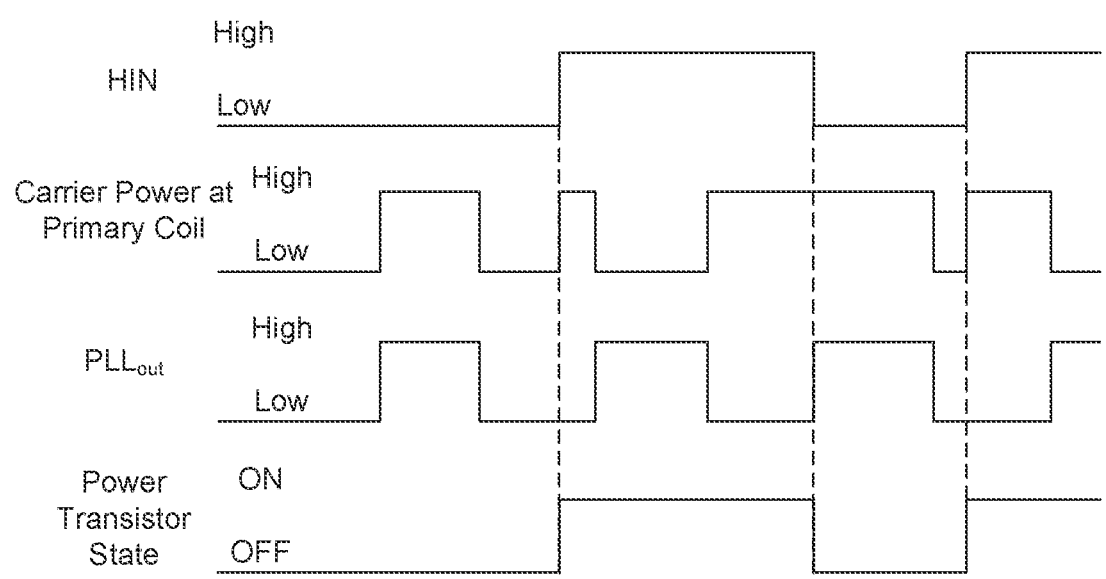
FIG. 8 is a signal diagram of signals at various stages of a PLL-based communication system according to one or more embodiments.

FIG. 8 is a signal diagram of signals at various stages of the PLL-based communication system, including PWM control signal HIN, the carrier power signal at the primary coil of the cored transformer, the output signal PLLout of the PLL 73, and the on/off state of the power transistor 2 controlled by gate driver 29.

The PLL 73 on the secondary side generates a precise replica of the reference power carrier signal (square wave) in terms of phase and frequency generated by the power transfer carrier generator 60 on the primary side. The locking of this PLL 73 occurs during the startup of the power supply in the high side and before effective switching of transistor 2 by the gate driver 29. The replicated reference power carrier signal is then used by a two-phase discriminator to determine a value of a transmitted bit (i.e., a 0 or a 1) in order to control the on/off state of the transistor 2, with a 0 bit turning off the transistor and a 1 bit turning on the transistor 2. A similar transmission scheme can also be used for controlling transistor 1 via cored transformer 50.

From FIG. 8, the phase of the carrier power signal at the primary coil becomes inverted by diverter 62 with respect to PLLout, thus communicating an ON state (HIN=high) is desired. When an OFF state (HIN=low) is desired, the phase of the carrier power signal at the primary coil is switched by the diverter 62 to be in phase with PLLout. Of course, out-of-phase and in-phase could be configured to have opposite meanings, with out-of-phase indicating the ON state and in-phase indicating the OFF state by small adjustments in programming and circuitry.

The PLL-based communication system described in FIGS. 5 and 6 shows intrinsically lower performances than the bidirectional communication system shown in FIG. 2. The PLL-based communication system only transmits unidirectionally a single bit. If for any reason the PLL locking condition is lost, then the communication system fails and is not possible to easily transmit back a fault condition. On the other hand, the PLL-based communication system is capable of faster transmissions to reduce delay in communicating the on/off states of the transistor 2 when compared to the bidirectional communication system.

Thus, it is possible to combine the two communication systems (i.e., the PLL-based communication system and the bidirectional communication system) to take advantage of their benefits. Both communication systems can be coupled to the terminals of the cored transformer and provide communications to their respective digital cores. In particular, the combined communication system implements the bidirectional communication in addition to PLL-based fast transmission. The fast power switch commutation is performed by the PLL-based communication system, but right after the commutation the high-side chip 20 can expect a serial communication from the bidirectional communication system to confirm the new switch state of transistor 2. If the serial communication does not occur within a given small delay period, then the digital core 28 turns off the transistor 2 and generates a fault signal to be transmitted to the digital core 16 via the bidirectional communication system.

Accordingly, the digital core 28 monitors for a data transmission received by the PLL-based communication system (i.e., by the data receiver system 400), detects the reception of a data bit for controlling the state of transistor 2, and begins a timer to further monitor for a data transmission received by the bidirectional communication system (i.e., by receiver 26). If the timer reaches a predetermined threshold or lapses before a data transmission is received by receiver 26, then a fault signal is generated and transmitted by the transmitter 25. If a data transmission is received by receiver 26 within the predetermined threshold, a fault signal is not generated.

Additional embodiments include:

1. A gate driver communication system, comprising:

a cored transformer comprising a primary coil arranged on a primary side, a secondary coil arranged on a secondary side, and a core that links the primary coil to the secondary coil, wherein the secondary coil is configured to receive a data encoded power signal;

a primary side power signal generator coupled to the primary coil and configured to generate the data encoded power signal with a fixed frequency and a phase that varies based on an encoded bit value;

a power transfer carrier generator arranged on the primary side and configured to generate a zero-phase power carrier signal having the fixed frequency and a fixed phase;

an inverter configured to invert the zero-phase power carrier signal to generate a phase-shifted power carrier signal; and a diverter configured to selectively couple the zero-phase power carrier signal to the primary side power signal generator to encode a bit having a first bit value onto the data encoded power signal, and to selectively couple the phase-shifted power carrier signal to the primary side power signal generator to encode a bit having a second bit value onto the data encoded power signal, wherein the primary side power signal generator is configured to generate the data encoded power signal with encoded bits thereon based on receiving the zero-phase power carrier signal or the phase-shifted power carrier signal.

2. The gate driver communication system of embodiment 1, further comprising:

a power transistor arranged on the secondary side and configured to conduct a load current based on an on/off state of the power transistor; and a gate driver arranged on the secondary side and configured to drive the on/off state of the power transistor based on the encoded bits extracted by the PLL-based receiver, wherein the gate driver is configured to turn on the power transistor in response to the data encoded power signal being encoded with the first bit value and the gate driver is configured to turn off the power transistor in response to the data encoded power signal being encoded with the second bit value.

3. The gate driver communication system of embodiment 2, wherein:

the data encoded power signal is encoded with the first bit value when the diverter couples the phase-shifted power carrier signal to the primary side power signal generator, and the data encoded power signal is encoded with the second bit value when the diverter couples the zero-phase power carrier signal to the primary side power signal generator.

4. The gate driver communication system of embodiment 1, further comprising:

a phase-locked loop (PLL)-based receiver coupled to the secondary coil and configured to receive and decode the data encoded power signal to extract the encoded bits therefrom, wherein the PLL-based receiver comprises:

a PLL configured to generate a PLL signal that is locked in frequency and phase to the zero-phase power carrier signal;

a two-phase discriminator circuit configured to receive the PLL signal and determine a phase of the data encoded power signal received at the secondary coil based on the PLL signal; and a bit decoder configured to extract the encoded bits based on the determined phase of the data encoded power signal relative to a phase of the PLL signal.

5. The gate driver communication system of embodiment 4, further comprising:

a power supply circuit coupled to the secondary coil and configured to receive the data encoded power signal, convert the data encoded power signal to stored energy, and supply the stored energy to the PLL-based receiver.

6. The gate driver communication system of embodiment 5, further comprising:

a power transistor arranged on the secondary side and configured to conduct a load current based on an on/off state of the power transistor; and a gate driver arranged on the secondary side and configured to drive the on/off state of the power transistor based on the encoded bits extracted by the PLL-based receiver, wherein the power supply circuit is configured to supply the stored energy to the gate driver to enable the gate driver to drive the on/off state of the power transistor.

7. A gate driver communication system, comprising:

a cored transformer comprising a primary coil arranged on a primary side, a secondary coil arranged on a secondary side, and a core that links the primary coil to the secondary coil, wherein the secondary coil is configured to receive a data encoded power signal; and a phase-locked loop (PLL)-based receiver coupled to the secondary coil and configured to receive and decode the data encoded power signal to extract encoded bits therefrom, wherein the PLL-based receiver comprises:

a PLL configured to generate a PLL signal that is locked in frequency and phase to a reference signal;

a two-phase discriminator circuit configured to receive the PLL signal and determine a phase of the data encoded power signal received at the secondary coil based on the PLL signal; and a bit decoder configured to extract the encoded bits based on the determined phase of the data encoded power signal relative to a phase of the PLL signal.

8. The gate driver communication system of embodiment 7, wherein the bit decoder is a flip-flop.

9. The gate driver communication system of embodiment 7, further comprising:

a power supply circuit coupled to the secondary coil and configured to receive the data encoded power signal, convert the data encoded power signal to stored energy, and supply the stored energy to the PLL-based receiver.

10. The gate driver communication system of embodiment 9, wherein:

the power supply circuit includes a diode bridge and a tank capacitor, and the diode bridge is configured to rectify the power signals into a DC voltage that is stored by the tank capacitor.

11. The gate driver communication system of embodiment 10, further comprising:

a power transistor arranged on the secondary side and configured to conduct a load current based on an on/off state of the power transistor; and a gate driver arranged on the secondary side and configured to drive the on/off state of the power transistor based on the encoded bits extracted by the PLL-based receiver, wherein the power supply circuit is configured to supply the stored energy to the gate driver to enable the gate driver to drive the on/off state of the power transistor.

While various embodiments have been disclosed, it will be apparent to those skilled in the art that various changes and modifications can be made which will achieve some of the advantages of the concepts disclosed herein without departing from the spirit and scope of the invention. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent on the independent claim.

It is further to be noted that methods disclosed in the specification or in the claims may be implemented by a device having means for performing each of the respective acts of these methods. For example, the techniques described in this disclosure may be implemented, at least in part, in hardware, software, firmware, or any combination thereof, including any combination of a computing system, an integrated circuit, and a computer program on a non-transitory computer-readable recording medium. For example, various aspects of the described techniques may be implemented within one or more processors, including one or more microprocessors, DSPs, ASICs, or any other equivalent integrated or discrete logic circuitry, as well as any combinations of such components.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments, a single act may include or may be broken into multiple sub acts. Such sub acts may be included and part of the disclosure of this single act unless explicitly excluded.

What is claimed is:

1. A gate driver communication system, comprising:
   a cored transformer comprising a primary coil arranged on a primary side, a secondary coil arranged on a secondary side, and a core that links the primary coil to the secondary coil, wherein the secondary coil is configured to receive power signals and uplink data signals from the primary coil;
   a primary side power signal generator coupled to the primary coil and configured to generate the power signals having a first frequency;
   a primary side data transmitter coupled to the primary coil and configured to generate the uplink data signals having a second frequency different from the first frequency; and
   a primary side controller configured to allocate the power signals and the uplink data signals to the primary coil according to a plurality of time slots, wherein the power signals are allocated to first time slots of the plurality of time slots and the uplink data signals are allocated to second times slots of the plurality of time slots,
   wherein the primary side power signal generator comprises a first full transistor bridge comprising a first output terminal coupled to a first terminal of the primary coil and a second output terminal coupled to a second terminal of the primary coil, and
   wherein the primary side data transmitter comprises a second full transistor bridge comprising a third output terminal coupled to the first terminal of the primary coil and a fourth output terminal coupled to the second terminal of the primary coil.

2. The gate driver communication system of claim 1, wherein:
   the primary side controller is configured to activate the primary side power signal generator and deactivate the primary side data transmitter during the first time slots, and
   the primary side controller is configured to activate the primary side data transmitter and deactivate the primary side power signal generator during the second time slots.

3. The gate driver communication system of claim 1, wherein the primary side controller is configured to allocate the power signals and the uplink data signals to the primary coil according to a plurality of time slots using time division multiple access (TDMA).

4. The gate driver communication system of claim 1, wherein each uplink data signal is a multi-bit data signal.

5. The gate driver communication system of claim 1, wherein the first frequency is less than the second frequency.

6. The gate driver communication system of claim 1, wherein each of the first time slots have a first length and each of the second time slots have a second length that is less than the first length.

7. The gate driver communication system of claim 1, wherein the primary side is configured to operate in a first voltage domain and the secondary side is configured to operate in a second voltage domain galvanically isolated from the first voltage domain.

8. The gate driver communication system of claim 1, further comprising:
   a secondary side receiver coupled to the secondary coil and configured to demodulate the uplink data signals to extract data therefrom;
   a secondary side controller configured to process the data extracted by the secondary side receiver; and
   a power supply circuit coupled to the secondary coil and configured to receive the power signals, convert the power signals to stored energy, and supply the stored energy to the secondary side receiver and the secondary side controller.

9. The gate driver communication system of claim 8, wherein:
   the power supply circuit includes a diode bridge and a tank capacitor, and
   the diode bridge is configured to rectify the power signals into a DC voltage that is stored by the tank capacitor.

10. The gate driver communication system of claim 8, further comprising:
    a power transistor arranged on the secondary side and configured to conduct a load current based on an on/off state of the power transistor; and
    a gate driver arranged on the secondary side and configured to drive the on/off state of the power transistor based on the data extracted by the secondary side receiver,
    wherein the power supply circuit is configured to supply the stored energy to the gate driver to enable the gate driver to drive the on/off state of the power transistor.

11. The gate driver communication system of claim 1, further comprising:
    a secondary side data transmitter coupled to the secondary coil and configured to transmit downlink data signals, wherein the primary coil is configured to receive the downlink data signals from the secondary coil; and
    a primary side data receiver coupled to the primary coil and configured to demodulate the downlink data signals to extract data therefrom;
    wherein the primary side controller is configured to process the data extracted by the primary side receiver.

12. The gate driver communication system of claim 11, further comprising:
    a secondary side controller configured to detect a fault at the secondary side and generate a fault signal that indicates the detected fault, wherein the downlink data signals include the fault signal.

13. The gate driver communication system of claim 12, further comprising:
a switch coupled to two terminals of the secondary coil such that, when closed, the switch is configured to trigger an interrupt signal on the secondary coil by shorting the two terminals to a same potential,
wherein the secondary side controller is configured to control the switch, including closing the switch in response to detecting the fault,
the primary side data receiver is configured to receive the interrupt signal at the primary coil, and
the primary side controller is configured to interrupt a transmission of a uplink data signal or a power signal in response to the received interrupt signal to allow the secondary side data transmitter to transmit the fault signal to the primary side data receiver.

14. The gate driver communication system of claim 1, wherein the primary side controller is configured to operate the first full transistor bridge and the second full transistor bridge in a complementary manner such that the first full transistor bridge is off while the second full transistor bridge is active and the second full transistor bridge is off while the first full transistor bridge is active.

15. The gate driver communication system of claim 1, wherein the primary side controller is configured to operate the first full transistor bridge and the second full transistor bridge in a complementary manner such that the first full transistor bridge is configured to be in a high-impendence state while the second full transistor bridge is transmitting the uplink data signals and the second full transistor bridge is configured to be in a high-impendence state while the first full transistor bridge is transmitting the power signals.

16. A gate driver communication system, comprising:
a cored transformer comprising a primary coil arranged on a primary side, a secondary coil arranged on a secondary side, and a core that links the primary coil to the secondary coil, wherein the secondary coil is configured to receive power signals and uplink data signals from the primary coil;
a primary side power signal generator coupled to the primary coil and configured to generate the power signals having a first frequency;
a primary side data transmitter coupled to the primary coil and configured to generate the uplink data signals having a second frequency different from the first frequency;
a primary side controller configured to allocate the power signals and the uplink data signals to the primary coil according to a plurality of time slots, wherein the power signals are allocated to first time slots of the plurality of time slots and the uplink data signals are allocated to second times slots of the plurality of time slots;
a power transfer carrier generator arranged on the primary side and configured to generate a zero-phase power carrier signal having the first frequency;
an inverter configured to invert the zero-phase power carrier signal to generate a phase-shifted power carrier signal;
a diverter configured to selectively couple the zero-phase power carrier signal to the primary side power signal generator to encode a first bit value onto one of the power signals, and to selectively couple the phase-shifted power carrier signal to the primary side power signal generator to encode a second bit value onto one of the power signals,
wherein the primary side power signal generator is configured to generate the power signals with encoded bits thereon based on receiving the zero-phase power carrier signal or the phase-shifted power carrier signal; and
a phase-locked loop (PLL)-based receiver coupled to the secondary coil and configured to receive and decode the power signals to extract the encoded bits.

17. The gate driver communication system of claim 16, further comprising:
a power supply circuit coupled to the secondary coil and configured to receive the power signals, convert the power signals to stored energy, and supply the stored energy to the PLL-based receiver.

18. The gate driver communication system of claim 17, wherein:
the power supply circuit includes a diode bridge and a tank capacitor, and
the diode bridge is configured to rectify the power signals into a DC voltage that is stored by the tank capacitor.

19. The gate driver communication system of claim 17, further comprising:
a power transistor arranged on the secondary side and configured to conduct a load current based on an on/off state of the power transistor; and
a gate driver arranged on the secondary side and configured to drive the on/off state of the power transistor based on the encoded bits extracted by the PLL-based receiver,
wherein the power supply circuit is configured to supply the stored energy to the gate driver to enable the gate driver to drive the on/off state of the power transistor.

20. The gate driver communication system of claim 16, wherein the PLL-based receiver comprises:
a PLL configured to generate a PLL signal that is locked in frequency and phase of the zero-phase power carrier signal;
a two-phase discriminator circuit configured to receive the PLL signal determine a phase of the power signals received at the secondary coil based on the PLL signal; and
a bit decoder configured to extract the encoded bits based on the determined phase of the power signals relative to a phase of the PLL signal.

21. A gate driver communication system, comprising:
a cored transformer comprising a primary coil arranged on a primary side, a secondary coil arranged on a secondary side, and a core that links the primary coil to the secondary coil, wherein the secondary coil is configured to receive power signals and uplink data signals from the primary coil;
a primary side power signal generator coupled to the primary coil and configured to generate the power signals having a first frequency;
a primary side data transmitter coupled to the primary coil and configured to generate the uplink data signals having a second frequency different from the first frequency;
a primary side controller configured to allocate the power signals and the uplink data signals to the primary coil according to a plurality of time slots, wherein the power signals are allocated to first time slots of the plurality of time slots and the uplink data signals are allocated to second times slots of the plurality of time slots;
a power transfer carrier generator arranged on the primary side and configured to generate a zero-phase power carrier signal having the first frequency;

an inverter arranged on the primary side and configured to invert the zero-phase power carrier signal to generate a phase-shifted power carrier signal; and a diverter arranged on the primary side and configured to selectively couple the zero-phase power carrier signal to the primary side power signal generator to encode a first bit value onto one of the power signals, and to selectively couple the phase-shifted power carrier signal to the primary side power signal generator to encode a second bit value onto one of the power signals, wherein the primary side power signal generator is configured to generate the power signals with encoded bits thereon based on receiving the zero-phase power carrier signal or the phase-shifted power carrier signal.

22. The gate driver communication system of claim 21, further comprising:

a secondary side receiver coupled to the secondary coil and configured to demodulate the uplink data signals to extract data therefrom;

a phase-locked loop (PLL)-based receiver coupled to the secondary coil and configured to receive and decode the power signals to extract the encoded bits;

a secondary side controller configured to process the data extracted by the secondary side receiver and the encoded bits extracted by the PLL-based receiver;

a power transistor arranged on the secondary side and configured to conduct a load current based on an on/off state of the power transistor; and a gate driver arranged on the secondary side and configured to drive the on/off state of the power transistor based on the data extracted by the secondary side receiver and the encoded bits extracted by the PLL-based receiver.

23. The gate driver communication system of claim 22, further comprising:

a power supply circuit coupled to the secondary coil and configured to receive the power signals, convert the power signals to stored energy, and supply the stored energy to the secondary side receiver, the secondary side controller, the PLL-based receiver, and the gate driver to enable the gate driver to drive the on/off state of the power transistor.

24. The gate driver communication system of claim 21, further comprising:

a receiver coupled to the secondary coil and configured to receive and decode the power signals to extract the encoded bits.

* * * * *